United States Patent [19]
Minemoto et al.

[11] Patent Number: 5,699,461
[45] Date of Patent: Dec. 16, 1997

[54] OPTICAL FIBER SENSORS AND METHOD FOR MAKING THE SAME

[75] Inventors: Hisashi Minemoto, Ootsu; Yukiko Yoshikawa, Osaka; Nobuki Itoh, Osaka; Daisuke Ishiko, Osaka; Satoshi Ishizuka, Osaka, all of Japan

[73] Assignee: Matsushita Electric Industrial Co., Ltd., Osaka, Japan

[21] Appl. No.: 497,353

[22] Filed: Jun. 30, 1995

[30] Foreign Application Priority Data

Dec. 12, 1994 [JP] Japan ................................... 6-307415
Apr. 28, 1995 [JP] Japan ................................... 7-106467

[51] Int. Cl.$^6$ ........................................... G02B 6/00
[52] U.S. Cl. ........................................... 385/12; 250/227.21
[58] Field of Search ................. 385/12, 128; 250/227.14, 250/227.17, 227.21, 227.24; 428/614; 359/42; 128/642; 338/34

[56] References Cited

U.S. PATENT DOCUMENTS

| | | | |
|---|---|---|---|
| 4,797,549 | 1/1989 | Ho et al. | 385/12 |
| 4,890,623 | 1/1990 | Cook et al. | 128/642 |
| 4,897,628 | 1/1990 | Ippommatsu et al. | 338/34 |
| 5,093,880 | 3/1992 | Matsuda et al. | 385/128 |
| 5,202,629 | 4/1993 | Seike et al. | |
| 5,210,800 | 5/1993 | Asai et al. | 385/12 |
| 5,244,748 | 9/1993 | Weeks, Jr. et al. | 428/614 |
| 5,321,258 | 6/1994 | Kinney | 250/227.21 |
| 5,440,411 | 8/1995 | Fujiwara et al. | 359/42 |
| 5,452,393 | 9/1995 | Stowe et al. | 385/123 |

FOREIGN PATENT DOCUMENTS

| | | |
|---|---|---|
| 0505185 | 9/1992 | European Pat. Off. |
| 63-60410 | 3/1988 | Japan |
| 363606 | 3/1991 | Japan |
| 6242149 | 9/1994 | Japan |

OTHER PUBLICATIONS

Journal Of Light Wave Technology, vol. 8, No. 8, 1 Aug. 1990, pp. 1151—1161, XP000174447, Kazuo Shiraishi et al: "Beam Expanding Fiber Using Thermal Diffusion Of The Dopant".

"High frequency magnetic field sensors based on the Faraday effect in garnet thick films" by R. Wolfe et al; Appl. Phys. Lett. 60 (17), 27 Apr. 1992; pp., 2048-2050.

"Fiber–Optic Monitoring Sensor System for Power Distribution Lines" by D. Ishiko et al; National Technical Report vol. 38, No. 2, Apr. 1992; pp. 255-261 (w/ English abstract).

"Fiber–Optic Instrument for Temperature Measurement" by K. Kyuma et al; IEEE Journal of Quantum Electronics vol. QE-18, No. 4, Apr. 1982.

"Magneto–optical properties of $(BiGdY)_3Fe_5O_{12}$ for optical magnetic field sensors" by Kamada et al; J. Appl. Phys. 75(10), 15 May 1994; pp., 6801-6803.

"Submicroampere–per–root–hertz current sensor based on the Faraday effect in Ga:YIG" by A. H. Rose et al; Optic Letters, vol. 18, No. 17; Sep. 1, 1993; pp., 1471-1473.

"Polarization–Independent In–Line Optical Isolator with Lens–Free Configuration" by K. Shiraishi et al; Journal Of Lightwave Technology, vol. 10, No. 12; Dec., 1992; pp., 1839-1842.

*Primary Examiner*—Rodney B. Bovernick
*Assistant Examiner*—Yisun Song
*Attorney, Agent, or Firm*—Lowe, Price, LeBlanc & Becker

[57] ABSTRACT

An optical fiber sensor which comprises a substrate having a groove pattern, an optical fiber which includes a shaped, bare optical fiber portion of an inverted U form and capable of being received or accommodated in the groove pattern of the substrate, and jacketed optical fiber portions extending from the shaped optical fiber rod portion at opposite ends thereof, and an optical modulation unit which is fixedly provided in a light path of the bare optical fiber portion and placed in at least one groove formed in the substrate. A method for fabricating the sensor is also described. The sensors include magnetic filed/current, electric field/voltage and temperature sensors.

44 Claims, 18 Drawing Sheets

DIRECTION OF MAGNETIC FIELD

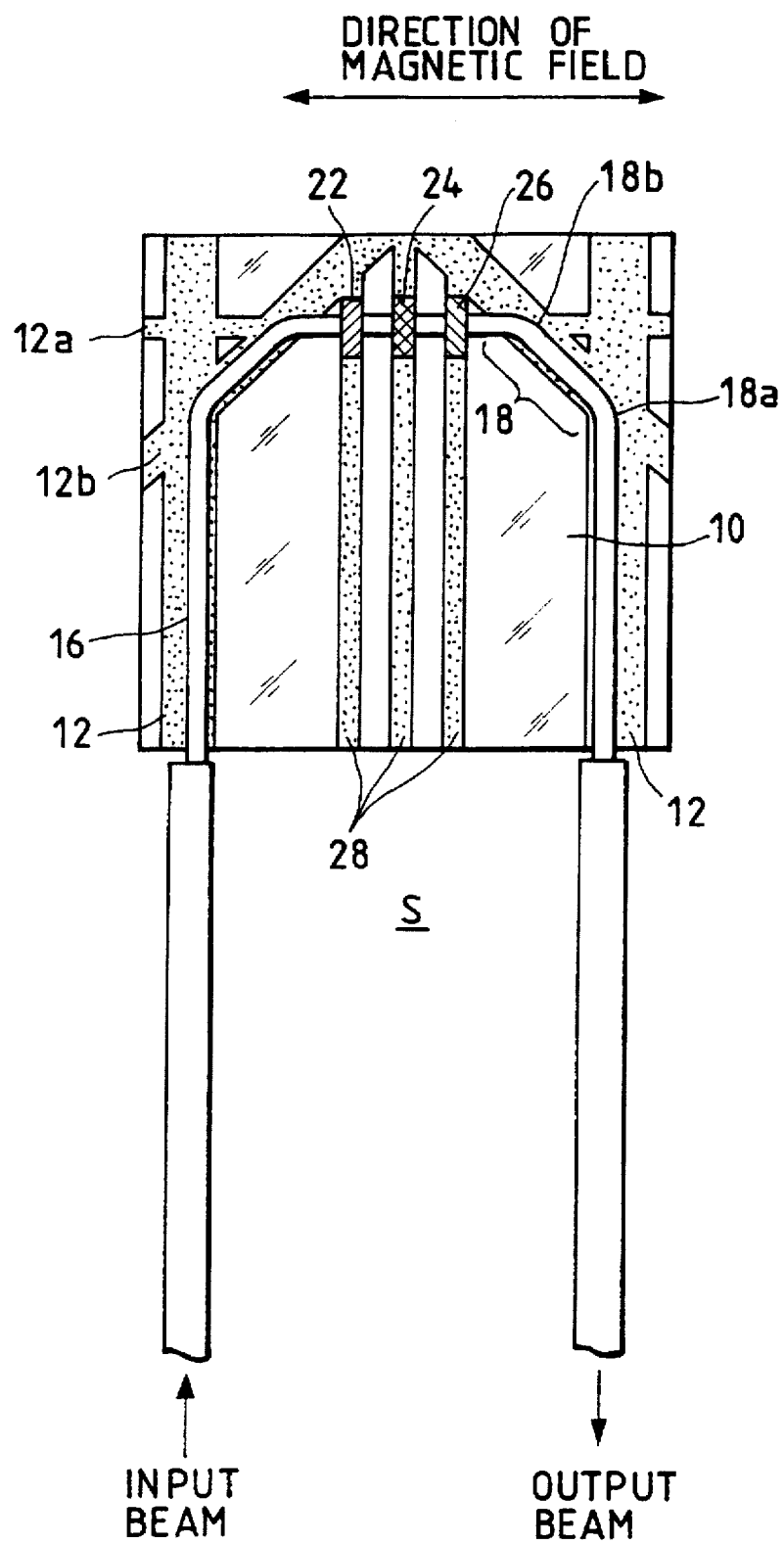

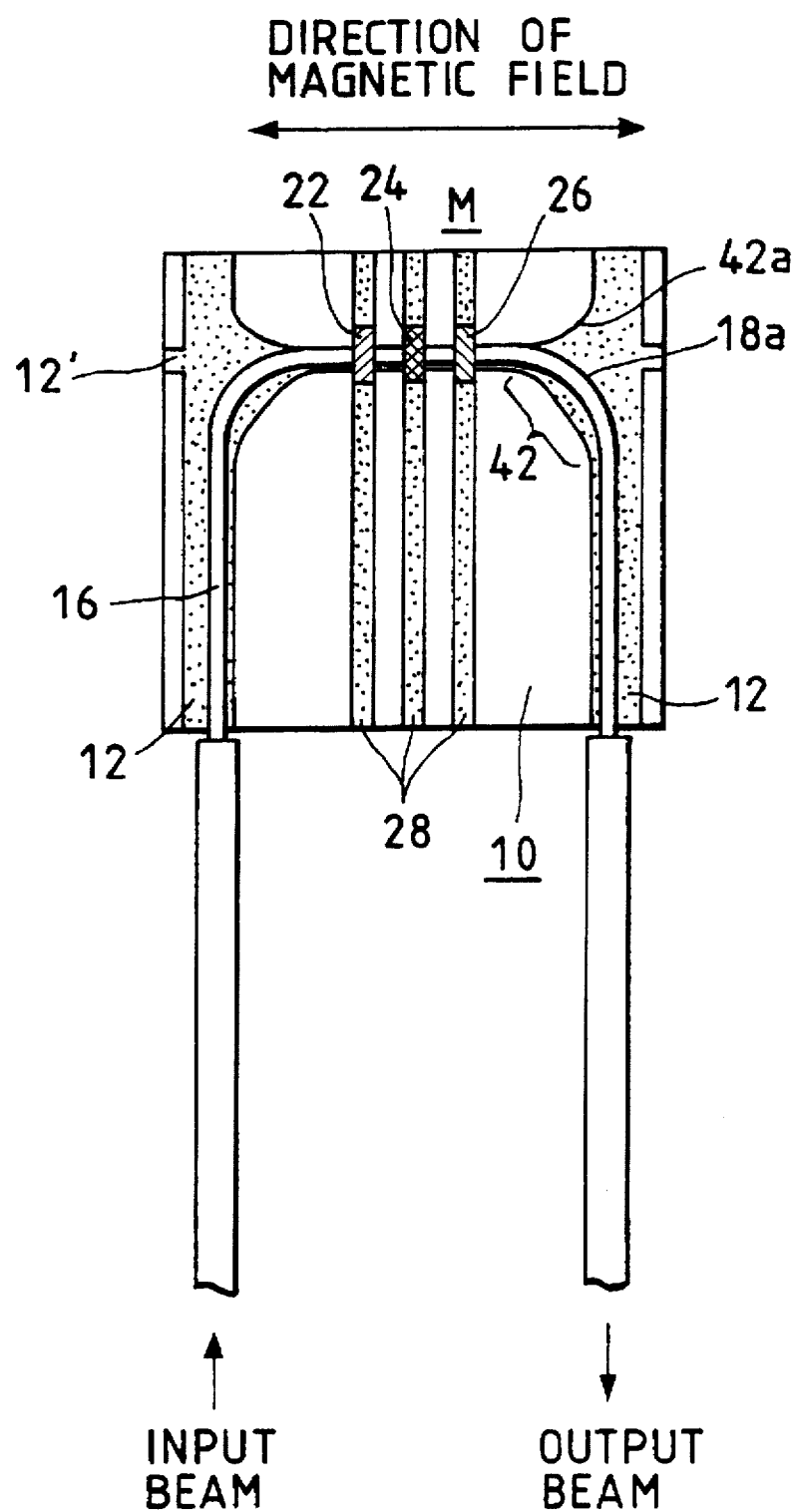

12. # OPTICAL FIBER SENSORS AND METHOD FOR MAKING THE SAME

BACKGROUND OF THE INVENTION

1. Field of the Invention

This invention relates to optical fiber sensors which make use of a light beam as a measuring means and are useful for measurements of variations of magnetic field (current), electric field (voltage), temperature, and the like therewith.

2. Description of the Prior Art

As optical element techniques, optical measuring techniques and optical communication techniques have recently been in progress, optical fiber sensors and optical integrated devices for optical communication systems have been put into practice in various fields or are now being trader study or investigation for practical usage. For instance, optical fiber sensors have not only good insulating properties, but also good characteristics such as a high resistance to electromagnetic inductive noises such as from thunder. Accordingly, the sensors are being steadily put into practice as a optical fiber current sensor utilizing a magnetooptic effect and also as an optical fiber voltage sensor utilizing an electrooptic effect, both for electric power systems (National Technical Report Vol. 38, No. 2, pp. 255–261 (1992), A. H. Rose et al; Optics Letters, Vol. 18, No. 17, pp. 1471–1473 (1993); and U.S. Pat. No. 5,202,629). Moreover, magnetooptic materials for optomagnetic field or for current sensors in this field have been actively developed (O. Kamada et al, (Journal of Applied Physics Vol. 75, No. 110, pp. 6801–6803 (1994)), and R. Wolfe et al, (Applied Physics Letters Vol. 60, No. 17, pp. 2048–2050 (1992)). In addition, optical fiber temperature sensors have been proposed wherein a temperature change in light absorption of GaAs crystals is utilized (K. Kyuma et al (IEEE Journal of Quantum Electronics Vol. QE-18, No. 4 (1982)).

Further, optical integrated circuits have been proposed, for example, in Japanese Laid-open Patent Application No. 63-60410 wherein optical waveguides are formed on a substrate and different types of optical elements are disposed in the waveguides. Alternatively, optical devices for optical communication have also been proposed in which an optical fiber is embedded in a groove and grooves and other grooves are separately formed by means of a rotating blade saw in which optical elements are separately inserted in position, respectively (K. Shiraishi et al, J. Lightwave Tech. Vol. 10, No. 12, pp. 1839–1842 (1992), and Japanese Laid-open Patent Application No. 3-63606). In recent years, liner-assembled optical fiber sensors using a thin film polarisor have been proposed for the purposes of miniaturization of optical fiber sensor and also of lensless assembling.

These known optical fiber sensors, optical parts and optical circuits have the following problems, which are described with reference to FIG. 18. This figure is a schematic view of a typical arrangement of a known optical fiber magnetic field/current sensor. An optical fiber magnetic field sensor S includes a beam inlet side collimator C and a beam outlet side collimator D which are, respectively, constituted of an optical fiber 180, a ferule 181, and a lens 182. Each collimator is fixed with a holder 187. The sensor S further includes an optical element unit M. The unit M has a polarizer 183, garnet crystals 184, an analyzer 185 and a reflection mirror 186 sequentially arranged in this order. The beam inlet side collimator C is optically connected to the polarizer 183 and the outlet side collimator D is optically connected to the reflection mirror 186 as shown.

The known optical fiber sensor is so assembled that the optical fiber, lens, polarizer, magnetooptic material (or electrooptic material), analyzer, mirror and the like optic parts are fixed such as with an adhesive on a substrate (not shown) while appropriately adjusting optical axes of the optical elements. This requires much time for assembling one sensor, with the attendant problem that mass productivity is poor. In addition, the polarizer, analyzer and mirror have, respectively, a size as large as approximately 5 mm square, with the problem that limitation is placed on the size of the sensor as a whole.

With an optical temperature sensor utilizing a temperature dependence on light absorption, any polarizer and analyzer are not necessary, enabling one to make a smaller-size sensor. However, this type of sensor has, aside from the problems set out above, another problem that optical elements used become much elongated, thus being inconvenient for practical applications.

For optical parts of the type wherein glass waveguides are formed on a substrate and grooves are formed on the way of the waveguide in which different types of optical elements are inserted, it is possible to finish up different optical circuit patterns at a time as in semiconductor circuit fabricating processes, thus ensuring high mass productivity. However, the optical parts undesirably involve a great optical loss at connections between the optical fiber and the optical waveguide. Additionally, an equipment for fabricating the optical waveguides is expensive.

With optical communication devices of the type wherein optical fibers are embedded in grooves formed in a substrate and then different grooves are formed by use of a rotating blade saw to insert optical elements therein, limitation is placed on fabrication of only linear or stream line, very elongated optical parts, like the case of the optical temperature sensors. Thus, a difficulty is involved in making an optical element which is small in size along a beam propagating direction. This eventually leads to the problem that applications to optical fiber sensors are difficult. Further, a jacket-free or bare optical fiber alone is embedded in the substrate, so that the optical fiber is liable to break down at portions thereof extending from the substrate, i.e. in the vicinity of an inlet of the optical fiber to the substrate or an outlet from the substrate.

Linear-assembled optical fiber sensors using multilayered, thin film polarizer or a laminated polarizer requires smaller-size optical parts, thus presenting the problem that it takes much longer time than in other prior art sensors, for assembling operations including optical axis adjustment. Like the optical fiber temperature sensors and the linear-assembled communication devices, only optical devices which are linear and very elongated are possible to fabricate in this case. Taking optical fiber interconnections into consideration, the resulting optical fiber sensor is so elongated as 40 to 50 mm in length in a minimum. If the linear optical fiber sensor is applied as an optical current or magnetic field sensor, the direction of the magnetic field being applied is the same as the direction of the optical fiber arranged. This type of linear optical fiber sensor is difficult to apply to a optical fiber sensor system of the type as shown in FIG. 3. This is because the optical fiber sensor cannot be disposed in a gap of an iron core at which the magnetic field is concentrated, thus being difficult to use as disposed around an electric power cable. In addition, a linearly, very elongated optical fiber sensor undesirably places limitation on the size of a casing accommodating the sensor therein. It will be noted here that the sensor system shown in FIG. 3 will be illustrated in more detail hereinafter.

SUMMARY OF THE INVENTION

It is accordingly an object of the invention to provide an optical fiber sensor which overcomes the problems involved in the prior art and includes a shaped, bare optical fiber portion and accommodated in and fixed to a groove pattern of a substrate.

It is another object of the invention to provide an optical fiber sensor which is small in size and can be fabricated in a simple manner at a high productivity.

It is a further object to provide several types of optical fiber sensors including current sensors, voltage sensors and temperature sensors which are substantially free of any optical loss in an optical waveguide because of the absence of coupling portions in the vicinity of beam input and output portions.

It is a still further object of the invention to provide a method for fabricating an optical fiber sensor of a small size wherein optical axes of optical elements can be readily adjusted unlike prior art assembling methods.

It is another object of the invention to provide a method for fabricating a plurality of optical fiber sensors at one time whereby mass productivity is ensured, thus being good in economy.

The above objects can be achieved, according to one embodiment of the invention, by an optical fiber sensor which comprises:

a substrate having a groove pattern;
an optical fiber which includes a shaped, bare optical fiber portion of an inverted U form and capable of being received or accommodated in the groove pattern of the substrate, and jacketed optical fiber portions extending from the shaped optical fiber portion at opposite ends thereof, the shaped optical fiber portion being fixed to the substrate; and
an optical modulation unit which is fixedly provided in a light path of the bare optical fiber portion and placed in a groove formed in the substrate.

It will be noted that the term "bare optical fiber" is intended to mean an optical fiber consisting of a core and a cladding layer but is free of any jacket and a buffering layer although a surface treating agent may be deposited on the cladding layer as used to permit intimate contact between the cladding layer and the buffer layer.

Preferably, the shaped optical fiber portion has two bent portions between which the optical modulation unit is provided.

If the optical fiber sensor is a magnetic field or current sensor, the optical modulation unit includes a polarizer, a magnetooptic element or modulator and an analyzer sequentially arranged in this order so that optical axes of the polarizer, the magnetooptic modulator and the analyzer are aligned. When the optical fiber sensor is used as an electric field or voltage sensor, a λ/4 plate is provided between the polarizer and the optical modulator. Preferably, the λ/4 plate is attached to either of the polarizer or the modulator. Moreover, when the sensor is used as a temperature sensor, the optical modulation unit consists of a single crystal plate made of a material whose light transmittance significantly varies depending on the temperature.

The polarizer, optical modulator and analyzer with or without a λ/4 plate may be integrally combined or may be separately provided at intervals therebetween provided that optical axes of these elements are adjusted properly.

In the practice of the invention, it is preferred that the bent portions of the shaped, bare optical fiber portion are curved at a bending radius, R, of 0.3 mm ≦R≦15 mm, more preferably 0.3 mm≦R≦5 mm so that the absolute value of optical loss at the bent portions is not greater than 5 dB. In order to reduce the absolute optical loss, the shaped optical fiber portions are preferably coated with a metal or a polymer paste comprising fine particles of a metal.

Moreover, each bent portion is so arranged as to have one, two or three bend points. If the bent portion has only one bend point, the bending angle is substantially at 90°, and when bent at two points, the bending angle at each point is 45°. Likewise, when the bare optical fiber portion is bent at three bend points, the bending angle at each point is 30° so that the total angle at the bent portion is 90°. In this connection, the groove pattern of the substrate has to be so formed as to correspondingly receive this bent portions of the bare optical fiber therein. For instance, the groove pattern is made of straight grooves which includes two parallel grooves and at least one groove intersecting with the two parallel grooves substantially at 90° at each intersection. In order to permit smooth reception of the shaped optical fiber portion, the intersecting portions should preferably be rounded off.

Moreover, it is preferred that in order to prevent breakage of the optical fiber including the bare portion, the jacketed portions of the optical fiber are partly inserted into the grooves of the groove pattern of the substrate and fixed with a bonding agent particularly in the vicinity of at least one, preferably both, of the beam inlet and outlet portions of the sensor.

According to another embodiment of the invention, there is also provided a method for fabricating an optical fiber sensor which comprises:

(a) providing a substrate;
(b) forming a groove pattern in the substrate;
(c) separately providing an optical fiber having a bare optical fiber portion and jacketed optical fiber portions extending from opposite ends of the bare optical fiber portion and shaping the bare optical fiber portion substantially in an inverted U form and capable of being received or accommodated in the groove pattern;
(d) setting and fixing the shaped bare optical fiber portion in the groove pattern;
(e) forming at least one groove in the substrate extending in parallel to two parallel grooves of the inverted U-shaped groove pattern through the fixed bare optical fiber portion; and
(f) fixedly setting, in a light path of the optical fiber, an optical modulator unit by inserting the unit in the at least one groove.

The groove pattern may be formed by two parallel grooves and one groove intersecting with the two parallel grooves substantially at 90°. In the case, the intersecting portions of the groove pattern are preferably rounded off to allow the shaped, bare optical fiber portion having two bent portions bent at a given radius of curvature to be received along the radius of curvature therein. In order to round off the intersecting portions, a grinder and/or a grind stone with an axle is used.

The groove pattern may be formed by a method using a rotating blade saw, sand blasting, molding in a mold or etching. When the rotating blade saw is used, the groove-forming speed is preferably in the range of 0.01 to mm/second. The blade should preferably be made of grains having a size of #200 to #4000, i.e. an average grain size of 60 to 3 mm/second. The blade should preferably be made of grains having a size of Moreover, in order to prevent breakage of the shaped, bare optical fiber portion in the vicinity of beam inlet and outlet portions of the groove pattern, it is preferred that the jacketed optical fiber is partly inserted in and fixed to the grooves of the groove pattern. To this end, this grooves in the vicinity of the beam input side, beam output side and/or the optical fiber bent portions are formed as being greater in width than other portions in a manner sufficient to accommodate the jacketed optical fiber or the shaped, bare optical fiber portions therein. Preferably, the groove width at these portions is 1.03 to 5 times the diameter of the jacketed optical fiber.

The optical fiber used should preferably be a multicomponent optical fiber or a plastic optical fiber which is readily shaped in a desired form. More particularly, these optical fibers can be readily bent at a desired bending angle by use of a blower with an electric resistance heater. With the multicomponent optical fiber, a hot temperature ranging from 450° C. to 600° C. is sufficient for the bending. On the other hand, the temperature ranging from 80° to 250° C. is sufficient for the bending for the plastic optical fiber.

The bare optical fiber portion or the jacketed optical fiber is preferably bonded to the substrate by means of ceramic bonding agents, solders, lower melting glasses and/or resin adhesives. In addition, the shaped, bare optical fiber portion are preferably coated with a metal or a polymer resin dispersing metal particles therein so as to reduce an optical loss.

If the optical modulation unit is made of a polarizer, an optical modulator and a polarizer with or without a λ/4 plate, which are spaced from each other, three grooves are formed to accommodate the polarizer, modulator and polarizer, respectively.

Further, where a plurality of optical fiber sensors are fabricated at one time, a plurality of the groove patterns are formed on a large-size substrate, followed by the steps (c) to (f) to make individual sensor units and cutting the substrate to obtain individual sensors.

BRIEF DESCRIPTION OF THE DRAWINGS

FIG. 7 is a schematic view showing an optical fiber sensor according to a still further embodiment of the invention;

FIG. 8 is a schematic view showing an optical fiber sensor wherein a groove pattern is rounded off at intersecting portions of grooves of the pattern according to another embodiment of the invention;

PREFERRED EMBODIMENTS OF THE INVENTION

Figure 1:
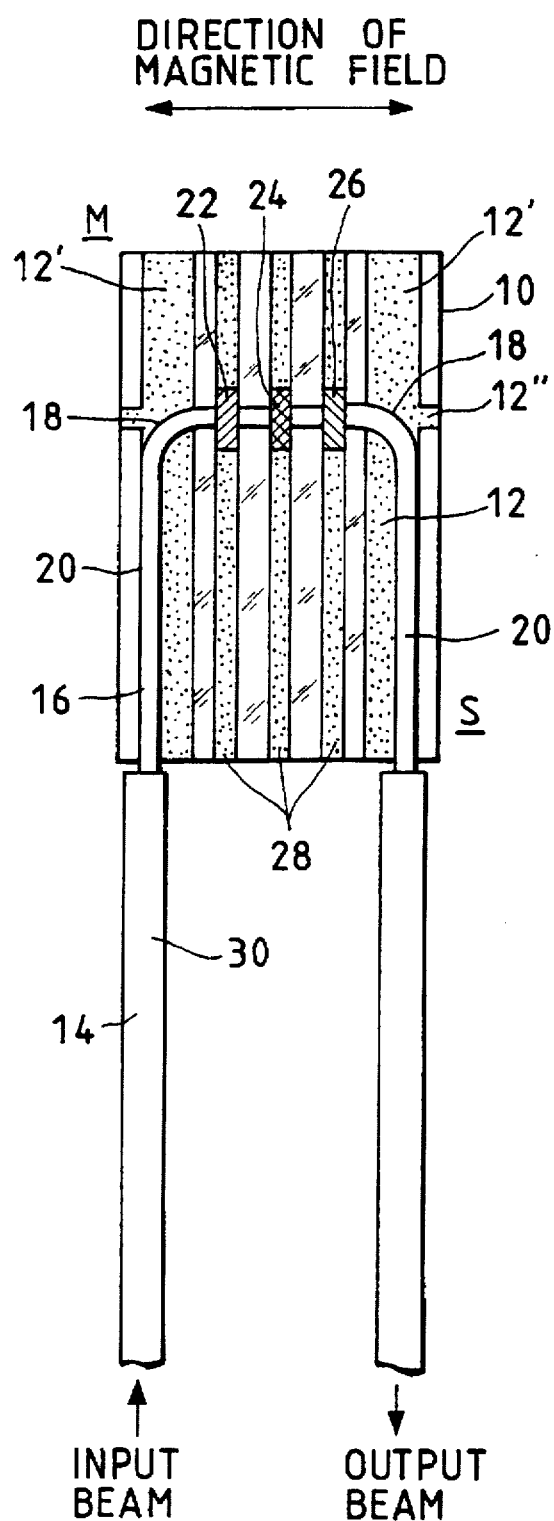
FIG. 1 is a schematic view showing an optical current sensor according to one embodiment of the invention.

Reference is now made to the accompanying drawings, in which like reference numerals indicate like parts or members throughout the specification, and particularly to FIGS. 1 and 2.

FIG. 1 shows a optical fiber magnetic field or current sensor according to one embodiment of the invention. The sensor is indicated generally as S and includes a substrate 10 having a groove pattern 12 capable of accommodating and fixing part of an optical fiber 14. The sensor S has an optical fiber 14 having a bare optical fiber portion 16 shaped substantially as an inverted U form having two bent potions 18 and two parallel portions 20 extending, respectively, from the two bent portions 18. The bare optical fiber portion 16 is fixedly set in the groove pattern 12 as shown and has a modulator unit M in a light path between the two bent portions 18. In this case, the modulator unit M includes a polarizer 22, a magnetooptical element or modulator 24 made, for example, of garnet single crystals, and an analyzer 26 sequentially arranged in this order at intervals therebetween as shown. Elongated grooves 28 extending parallel to the two parallel portions 20 are for inserting the polarizer 22, optical modulator 24 and analyzer 26 therethrough in position.

The jacketed portion of the optical fiber 14 has a jacket 30 covering the bare optical fiber portion 16 therewith.

The substrate 10 used for this purpose may be made of ceramics, glasses or the like as is known in the art. Although depending on an intended size of a final sensor, the substrate usually has a thickness of 1 to 5 mm.

The substrate 10 is formed with the groove pattern 12 for fixing the shaped optical fiber portion 16 of an inverted U form as viewed in FIG. 1. The groove pattern 12 is constituted of two grooves 12' extending parallel to each other along the length of the substrate 10 and a groove 12" intersecting with the two parallel grooves 12' substantially at 90°. The two parallel grooves 12' are formed so widely as to snugly receive the shaped, bare optical fiber portion 16 therein in this embodiment.

Although the optical fiber may be made of quartz, it is preferred in the practice of the invention to use multicomponent glass optical fibers or plastic optical fibers. The multicomponent glass optical fibers include, for example, a core made of a composition comprising $SiO_2$ to which $B_2O_3$, Na$_2$O, K$_2$O and the like are added and a cladding layer made of a composition comprising SiO$_2$ to which B$_2$O$_3$, Tl$_2$O, Na$_2$O and the like are added. The plastic optical fibers are those which are mainly composed of polymethyl methacrylate.

The bare optical fiber portion 16 is shaped as an inverted U form as viewed in FIG. 1 and this portion has usually a diameter of from 125 to 1000 μm. Preferably, the bent portions are so formed as having a bending radius of from 0.3 to 15 mm in view of the optical loss and the size of the sensor. If the bending radius of curvature is smaller than 0.3 mm, the optical loss exceeds 5 dB. In addition, it is difficult to bend the bare optical fiber portion at a smaller radius reproducibly.

The sheath of the optical fiber 14 may include a buffer layer and a jacket as is known in the art.

The magnetic field sensor S has an optical modulation unit M in an optical path of the bare optical fiber portion 16 at a portion between the bent portions 18. The unit M includes a polarizer 22 made of glass, a magnetooptical modulator 24 made, for example, of garnet single crystals, and an analyzer 26 made of glass. Especially, the garnet single crystals used as the modulator 24 are formed, for example, by epitaxially growing a Bi-substituted garnet film of the formula, (BiYGdLa)$_3$(FeGa)$_5$O$_{12}$ on a substrate made, for example, of (GdCa)$_3$(MgZrGa)$_5$O$_{12}$.

The polarizer 22, magnetooptical modulator 24 and analyzer 26 are sequentially arranged in this order so that the optical axes of these elements are aligned. For the easy alignment of the optical axes, it is preferred that these elements are all in a rectangular fore which is larger in length by at least two times than the width of the groove 12".

In this embodiment, the polarizer 22, magnetooptical modulator 24 and analyzer 26 are kept in spaced relation with each other at given intervals. The thickness of these elements is, for example, in a range of 100 to 1000 μm.

As having set out just above, the optical modulation unit M of FIG. 1 has the elements 22, 24, 26 which are spaced from each other, but may be integrally combined. This is particularly shown in FIGS. 2a and 2b. In this embodiment, only one groove 28 is formed for inserting the optical modulation unit M. The unit M has a polarizer 22, a magnetooptical modulator 24 and an analyzer 26 which are bonded together with use of a bonding agent such as a resin adhesive. Examples of such resin adhesive include epoxy resins, acrylate resins and the like. By this, the sensor may be made smaller in size than in the case of FIG. 1.

Figure 2A:
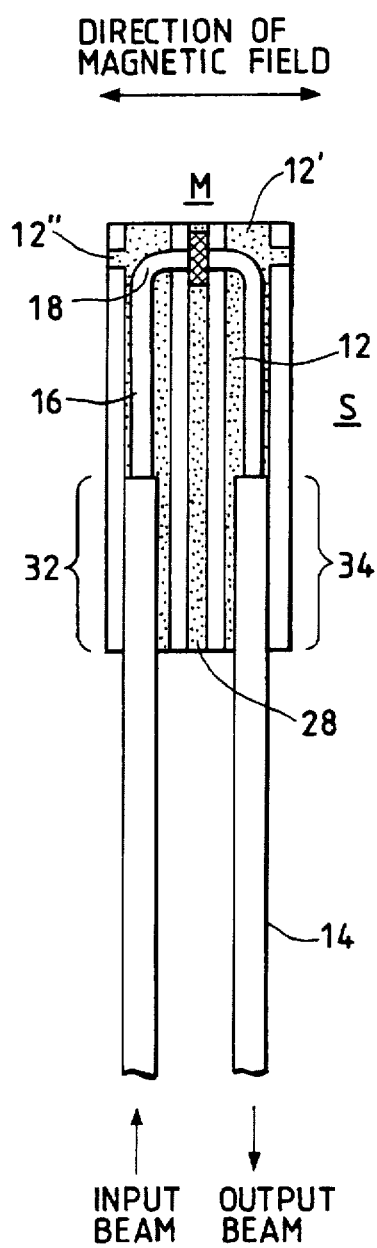
FIGS. 2a and 2b are, respectively, schematic views showing an optical current sensor according to another embodiment of the invention and an optical modulation unit used in this embodiment.

In this embodiment, as shown in FIG. 2a, the jacketed optical fiber 14 is set in the groove pattern 12 in the vicinity of a beam inlet portion 32 and a beam outlet portion 34.

In the embodiment of FIG. 1, the bare optical fiber portion 16 is fixed to the substrate 10 by means of resin adhesives, ceramic bonding agents, solders, low melting glasses or the like. With the case of FIG. 2a, the optical fiber portion 16 may be fixed by use of such bonding agents as set out above and the jacketed portion may be appropriately bonded to the substrate 10 by use of resin adhesives at both portions 32, 34.

In operation, when the sensor of the type shown in FIG. 1 or 2a is applied as a magnetic field sensor, a magnetic field is applied as shown by double arrow in FIGS. 1 and 2a. A light beam from a light source (not shown) optically connected to the optical fiber 14 is passed from one end thereof, as shown in the respective figures, to the optical modulator unit M. In the unit M, the beam from the optical fiber 14 is passed to the polarizer wherein the beam is converted to a linear polarized beam. The polarizing plane of the beam is rotated at an angle proportional to the magnitude of an applied magnetic field, so that when the linear polarized beam is passed through the magnetooptical element 24 and the analyzer 26, the resultant linear polarized beam is transmitted as having an intensity corresponding to the magnitude of the applied magnetic field.

Figure 3:
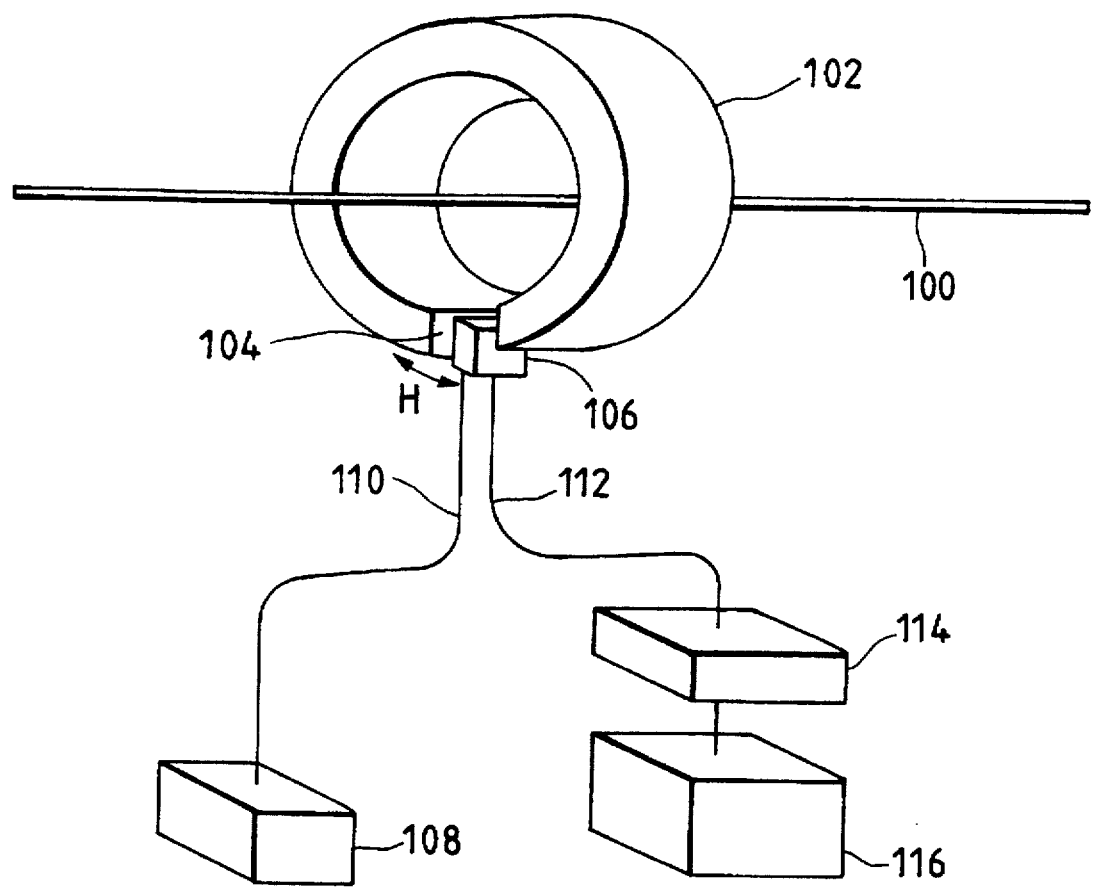
FIG. 3 is a schematic view showing a measuring system using an optical current sensor.

For instance, the optical fiber magnetic field or current sensor is applicable to a system shown in FIG. 3. In the figure, an electric power cable 100 is surrounded by an iron core ring 102 having a gap 104. A current sensor 106 is placed in the gap 104 as shown. The sensor 106 is optically connected to a light source unit 108 through an optical fiber 110 and the beam modulated in the sensor 106 is transmitted through an optical fiber 112 to a photodetection unit 114 and then to a signal processor 116 by a usual manner.

Figure 2B:
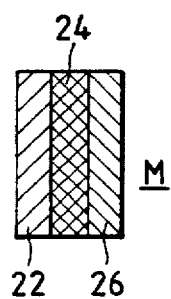

The current sensor has been described with reference to FIGS. 1, 2a and 2b. As a matter of course, an electric field or voltage sensor may be likewise fabricated. With the electric field sensor, the optical fiber sensor has such an arrangement as set out with respect to the current sensor except that the optical modulation unit M should have a polarizer 22, an electrooptical modulator 24 and an analyzer 26. In addition, a λ/4 plate should be further provided between the polarizer 22 and the optical modulator 24. Preferably, the λ/4 plate is attached to either the polarizer 22 or the optical modulator. The analyzer may be made of the same material as used for the current sensor. The λ/4 plate is made, for example, of quartz. The electrooptical element is made of a material capable of varying an optical polarizing state depending on the variation in electric voltage and includes, for example, LiNbO$_3$, LiTaO$_3$ or the like. If the unit M is integrally combined as shown in FIGS. 2a and 2b, the polarizer, λ/4 plate, electrooptical element and analyzer are combined in this order.

Similarly, a temperature sensor may have a similar arrangement as set forth with respect to the current sensor provided that the optical modulation unit M is made of an optical element alone without use of any polarizer and analyzer. Accordingly, the structure of the temperature sensor is as shown in FIG. 2a. The optical element is made, for example, of a material whose optical transmission varies depending on the temperature. Such a material includes, for example, GaAs, Si, Ge, chalcogenide glasses, Nd:glass or the like.

Reference is now made to FIGS. 4a to 4d, 5a, 5b and 6a to 6d to illustrate fabrication of the sensor S. For convenience's sake, fabrication of a current sensor is described.

Figure 4A:
FIGS. 4a to 4d are, respectively, schematic views showing a procedure of bending a bare optical fiber portion.
Figure 4B:
Figure 4C:
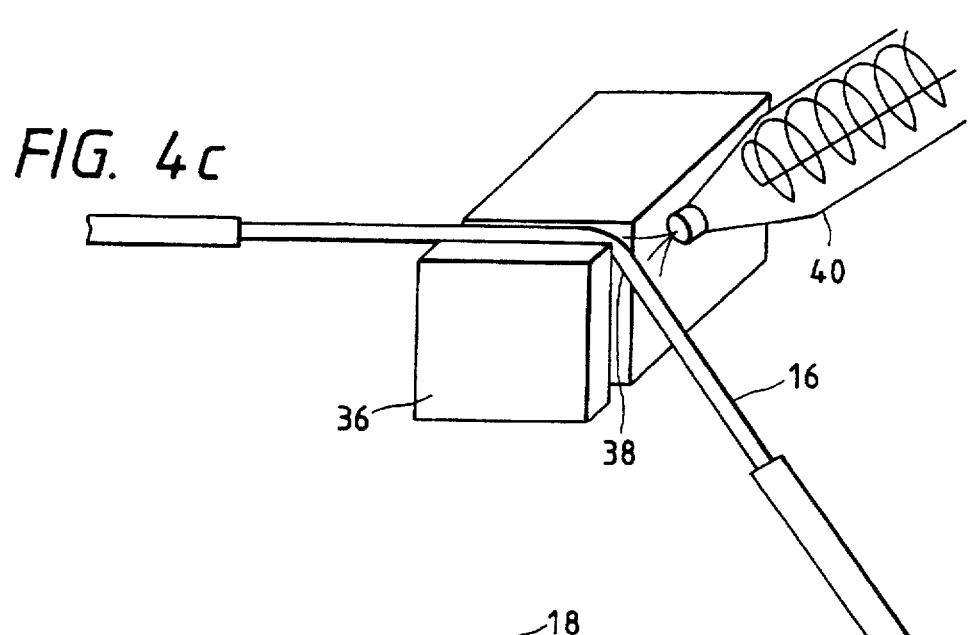

In FIGS. 4a to 4d, how to bend a bare optical fiber portion for setting in the groove pattern 12 of FIG. 1 is described. In FIG. 4a, there is shown a jacketed optical fiber 14, whose jacket layer 30 including a buffer layer and the like is partly removed from the jacketed optical fiber 14. Thus, the optical fiber 16 composed of a core and a cladding layer is exposed as shown in FIG. 4b. It will be noted that the optical fiber cladding layer may be attached with a surface treating agent which has been employed to facilitate intimate contact with the buffer layer. Then, the exposed optical fiber portion 16 is set in a stainless steel or ceramic die 36 having a groove 38 as shown in FIG. 4c. The groove 38 has a corner which is angled substantially at 90° and is rounded at a desired radius of curvature. In this condition, the bare optical fiber portion 16 is bent along the groove corner, for example, by heating with a blower 40 having an electric resistance heater while gradually bending as shown in FIG. 4c.

For ordinary quartz optical fibers, usual practice is to bend the optical fiber by application of a high temperature flame from a gas burner or by arcing. In this connection, however, if the flame or arcing is applied for multicomponent optical fibers or plastic optical fibers, temperatures become too high to melt down or burn the optical fiber rod being applied. Thus, it is very difficult to bend the quartz optical fiber along the mold groove 38.

To avoid this, the blower, which can appropriately control the temperature of hot air by controlling an electric current being passed to the resistance heater made, for example, of a nichrome wire or a Kanthal alloy wire, is used. In fact, bare optical fiber can be reproducibly bent by use of the hot air from the blower at a temperature of from 450° to 600° C. for the multicomponent optical fiber rod and from 80° to 250° C. for the plastic optical fiber.

If necessary, the die 36 may have a built-in heater, by which the bending curvature of the fiber portion can be more appropriately controlled as desired.

Figure 4D:
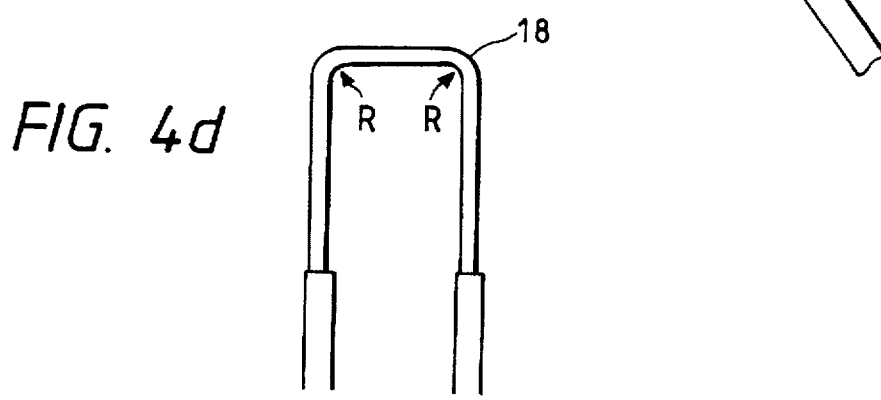

By the above procedure, the bare optical fiber portion can be bent substantially in the form of an inverted U form having two bent portions 18, each substantially at an angle of 90° with a radius of curvature, R, as shown in FIG. 4d.

For instance, the case where a multicomponent optical fiber having the numerical aperture of 0.4, a core diameter of 200 μm and a diameter of a bare optical fiber portion of 250 μm is used is described. The radius of curvature at the bent portions 18 can be arbitrarily set by controlling the curvature of the groove 38. Taking into consideration an optical loss and an intended size of an optical fiber sensor, the radius of curvature of the bare optical fiber portion is preferably set in the range of from 0.3 to 15 mm. For fabrication of a smaller-size sensor, the radius of curvature is set in the range of from 0.3 to 5 mm. If the radius of curvature of the bare optical fiber portion is smaller than 0.3 mm, the absolute value of optical loss becomes as great as 5 dB or over. Additionally, it is difficult to bend the optical fiber portion reproducibly at such a small angle.

Figure 5A:
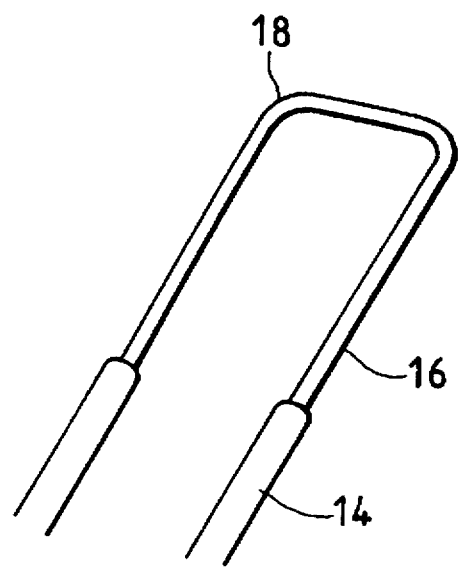
FIGS. 5a and 5b are, respectively, schematic views showing a shaped optical fiber and a substrate having a groove pattern capable of receiving the shaped optical fiber.
Figure 5B:
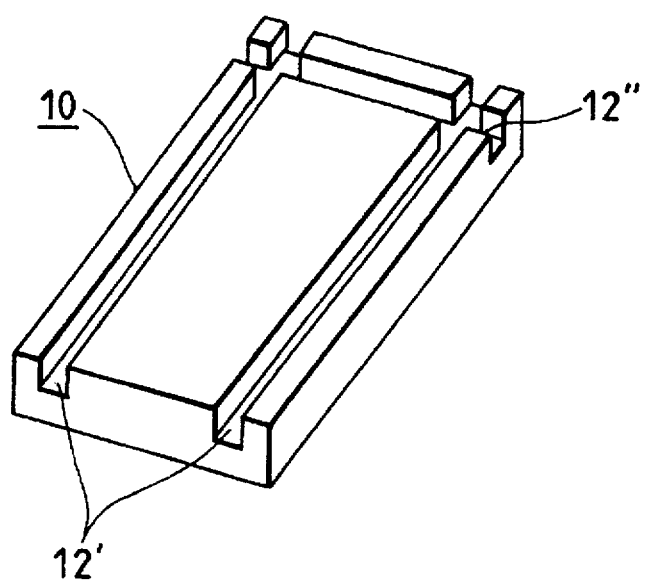

Separately, a substrate 10 which is grooved in a pattern capable of receiving the shaped optical fiber portion 16 therein is provided as shown in FIG. 5b. The optical fiber having the shaped portion 16 as shown in FIG. 5a is set in the groove and fixed to the substrate by means of a bonding agent such as resin adhesives, ceramic bonding agents, solder or lower melting glasses.

This is more particularly described with reference to FIGS. 6a to 6d.

Figure 6A:
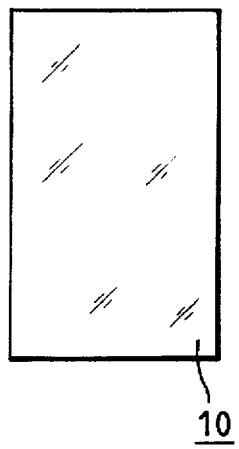
FIGS. 6a to 6d are, respectively, schematic views showing a procedure of making an optical fiber sensor according to a further embodiment of the invention.
Figure 6B:
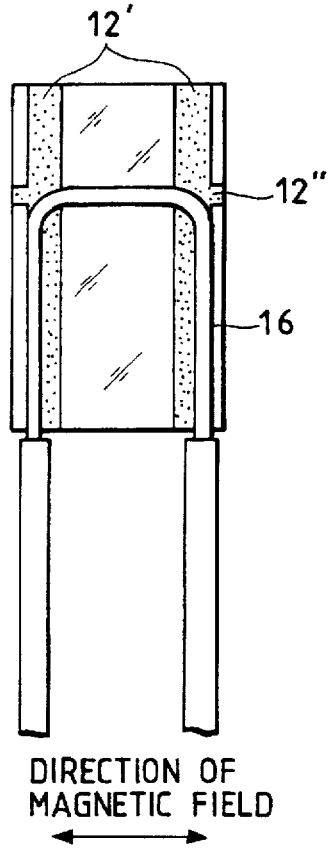

In FIG. 6a, there is shown a substrate made, for example of glass, engineering plastics such as polycarbonates, polyimides, glass fiber-reinforced polyamides, polyphenylene oxide or the like, or ceramics such as $Al_2O_3$, $SiO_2$ and the like as ordinarily used in the art. The substrate is formed with grooves 12' extending in parallel to each other and with a groove 12". The groove 12" is formed as intersecting vertically with both grooves 12' substantially at 90°. The grooves 12', 12" are formed, for example, by means of a rotating blade saw. Since the optical fiber is not cut off in this case, a high speed processing is possible wherein the groove forming speed is not lower than 1 mm/second and the blade should preferably have an abrasive grain size as great as #200 or below, i.e. 60 μm or higher. Then, the shaped optical fiber portion 16 of the optical fiber 14 is fixedly set in the groove pattern as shown in FIG. 6b. As is particularly seen in FIG. 6b, the shaped optical fiber portion is not exactly bent at 90° but is formed as having a certain radius of curvature, R, as set out hereinbefore. Since the radius of curvature at each bent portion 18 is formed as large, the shaped optical fiber portion can be conveniently accommodated in and fixed to the groove pattern. To this end, the parallel grooves 12' are formed as having a width which is 1.03 to 5 times as great as the diameter of the jacketed optical fiber 14. The shaped optical fiber portion 16 is fixed to the grooved portions of the substrate 10 by means of resin adhesives, ceramic bonding agents, solders or lower melting glass. Usually, solder is not directly bonded to a glass substrate. When using an indium solder and a ultrasonic soldering machine, bonding to a glass substrate becomes possible.

Figure 6C:
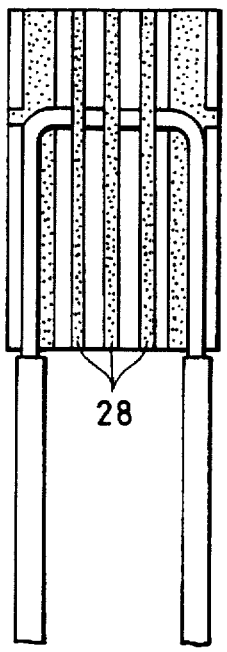

After fixing of the shaped optical fiber portion 16, three grooves 28 are formed substantially in parallel to the grooves 12' at given intervals for inserting a polarizer, an optical element and an analyzer in the light path between the bent portions 18 as shown in FIG. 6c. During the formation of the three grooves 28, the fiber portions between the bent portions 18 are also partly removed by the grooving. This groove formation is feasible by use of a rotating blade saw whose blade is made of abrasive grains having a size of #200 to #4000, i.e. 60 to 3 μm. In this case, the groove forming speed used is preferably in the range of 0.01 to 1 mm/second. Within the speed range defined above, the optical fiber portion cut at the time of the grooving is not so fairly roughened at the sections thereof. Thus, an optical loss as will occur at rough faces of the optical fiber can be reduced. If a blade made of larger-size grains is used or if the formation speed is increased, the cut faces become roughened, unfavorably resulting in a greater degree of light scattering. Although it is possible to use a blade which is made of grains having a much smaller size or to use a lower formation speed, the productivity unfavorably lowers.

The width of the grooves 28 should be determined in a manner sufficient to receive the respective elements therein. For instance, when the grooves 28 are each formed at a width of 0.51 mm, the respective elements are formed as having a slightly smaller thickness of, for example, 0.50 mm.

Figure 6D:
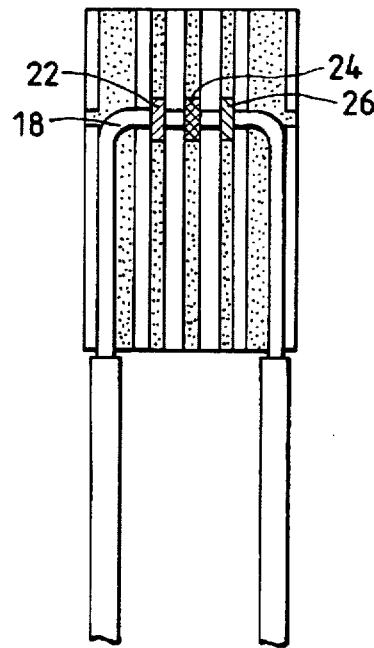

Thereafter, a polarizer chip 22 and an analyzer chip 26 made of a glass polarizing plate and an optical element made, for example, of garnet single crystals are inserted into the grooves 28 in the light path as shown in FIG. 6d. The optical element or modulator is made, for example of a Bi-substituted $(BiYGdLa)_3(FeGa)_5O_{12}$ epitaxially grown on a $(GdCa)_3(MgZrGa)_5O_{12}$ substrate. These polarizer, element and analyzer are fixed by means of resin adhesives such as thermosetting epoxy resins, thermosetting acrylate resins or the like. It will be noted that the polarizing planes of the polarizer and the analyzer are usually set as mutually inclined at 45° for current sensors.

According to the invention, when the radius of curvature at the bent portions of the bare optical fiber portion is in the range of 0.3 to 3 mm, the substrate 10 having a width of 10 mm along the direction of a magnetic field to be applied can be realized. Likewise, when the radius is in the range of 3 to 5 mm, the substrate width realized is 15 mm along the direction of the magnetic field. Thus, a small size sensor is fabricated.

In the above process, since a rotating blade saw is used, the grooves can be formed while suppressing a variation in width at a level not greater than approximately 10 μm. This means that mere insertion of the optical elements including the polarizer, optical element and analyzer permits the axes of these element to be aligned readily without resorting to specific time-consuming techniques of adjusting the optical axes. In addition, the effective beam diameter of the optical elements may be adequately only slightly greater than the diameter of the optical fiber. In this sense, the optical elements can be effectively made small in size. Thus, according to the process of the invention set out hereinbefore, the procedure becomes simplified owing to the unnecessity of adjusting the optical axes of the optical elements and the optical elements can be made small in size. In addition, in the absence of any coupling between the optical waveguide and the optical fiber, an optical loss at the coupling portions as will be one of problems in prior art is not produced in the practice of the invention.

Another embodiment of the invention is described with reference to FIG. 7. In FIG. 7, a substantial arrangement of the sensor S is similar to that of FIG. 1 except that the bent portions 18 of the bare optical fiber portion 16 have two equally angled points 18a and 18b each equally bent at 45°. By this, similar effects as attained with the sensor of FIG. 1 are obtained. To this end, the substrate 10 is formed with parallel grooves 12 and a groove 12a intersecting vertically with the grooves 12 like the case of FIG. 1. Further, grooves 12b are formed as bending substantially at 45° relative to the respective grooves 12 and the groove 12b as shown in FIG. 7. In this arrangement, the effective radius of curvature becomes greater than that of FIG. 1 although the resultant sensor may become greater in size, the optical loss at the optical fiber bent portions can be decreased. For instance, when the effective radius of curvature is in the range of 5 to 10 mm, the width of the substrate along the direction of magnetic field is appropriately 25 mm. Likewise, when the effective radius is in the range of 10 to 15 mm, the substrate width is approximately 35 mm.

In the embodiment of FIG. 7, the bent portion have two bend points each bent substantially at 90/2 =45° and has thus a total bend angle of 90°. It is possible to form a shaped fiber portion wherein each bent portion of the fiber portion has three equally-angled points each bent at d90/3=30° and is thus bent at 90° as a whole. As a matter of course, the substrate may be grooved as having three equally angled points. In this case, the light path can 90/3=30° for each of three equally angled points and is bent totally at 90° at one bent portion. Where the substrate is grooved as having, at on bent portion, four or more equally angled points each having an bending angle of 90°/n where n≧4, it becomes necessary to rotate the substrate several times for the grooving operations. This takes much time, thus being unsuitable for practical applications.

FIG. 8 shows a further embodiment of the invention wherein the intersections between the two parallel grooves 12' along the length of the substrate 10 and the groove 12' vertical to the grooves 12' are rounded off as 42 and 42a to allow a shaped optical fiber portion 16 to be accommodated even if the bent portions 18 have, respectively, a relatively great radius of curvature of, for example, 3 to 15 mm. This leads to a smaller optical loss.

For fabrication of such a rounded groove pattern, the intersections are rounded by means of a grind stone with a shaft and a grinder. Such a grind stone is made of abrasive grains having a size of #200, i.e. an average size of 60 μm. By the rounding off, it is not necessary that the grooves be formed as being wide as a whole for accommodating the shaped optical fiber portion. Nevertheless, the optical loss can be suppressed to a low level.

Figure 9:
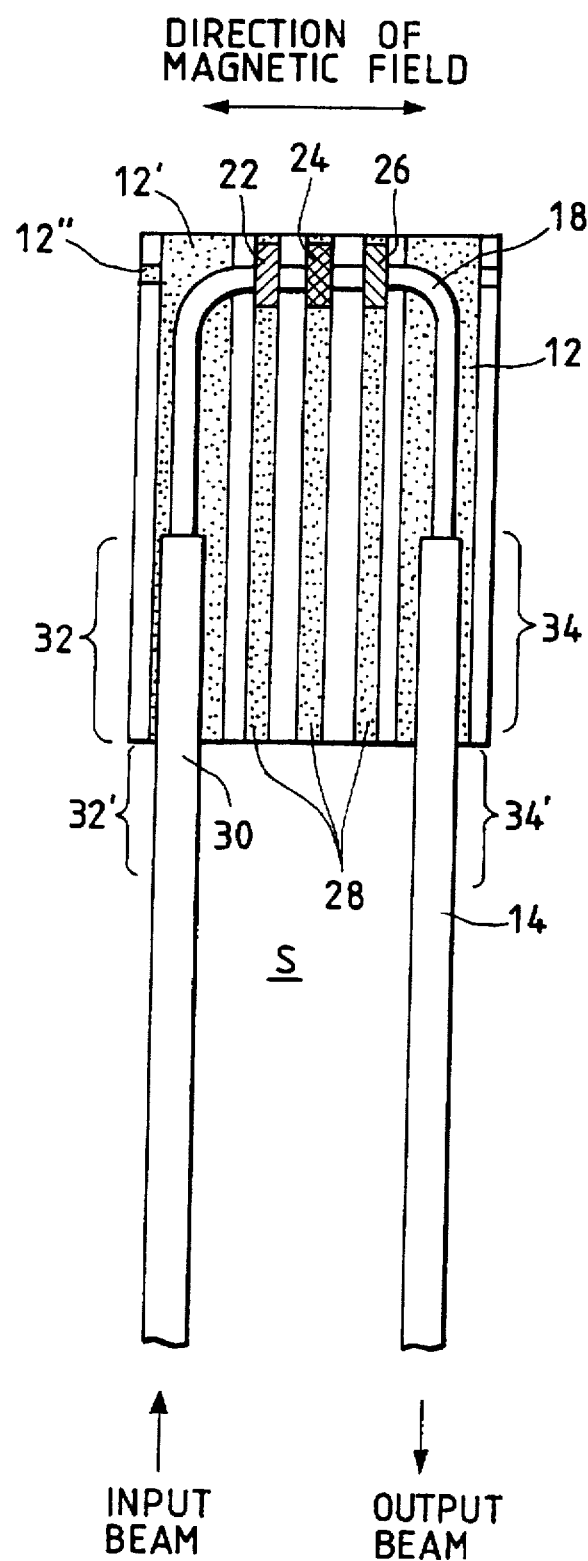
FIG. 9 is a schematic view showing an optical fiber sensor according to another embodiment of the invention.

FIG. 9 shows a further embodiment of the invention wherein a fundamental arrangement of the sensor is similar to that of FIG. 1 except that the jacketed optical fiber 14 is partly set in and fixed to the grooves at opposite sides of the parallel grooves in the vicinity of beam input and output portions 32, 34 of the sensor S. More particularly, the shaped, exposed optical fiber portion 16 is fixed along with the jacket 30 at the portions 32, 34. By this, the portion 16, as in FIG. 1, which is more liable to break on application of an external force at the inlet and outlet of the grooves 12' is reinforced by means of the jacket 30. In the case, the width of the grooves 12' is determined at 1.03 to 5 times the diameter of the jacketed optical fiber 14.

In this arrangement, the jacketed optical fiber is fixed to the grooves, thus preventing breakage of the optical fiber 14 in the vicinity of the inlet portions 32, 32' and outlet portions 34, 34'. Consequently, the sensor S is improved mechanical strength as a whole.

The attachment of the optical fiber 14 to the substrate 10 is such that the jacketed optical fiber 14 is bonded by means of thermosetting resin adhesives such as epoxy resins, which exhibit high adhesion strength.

Figure 10:
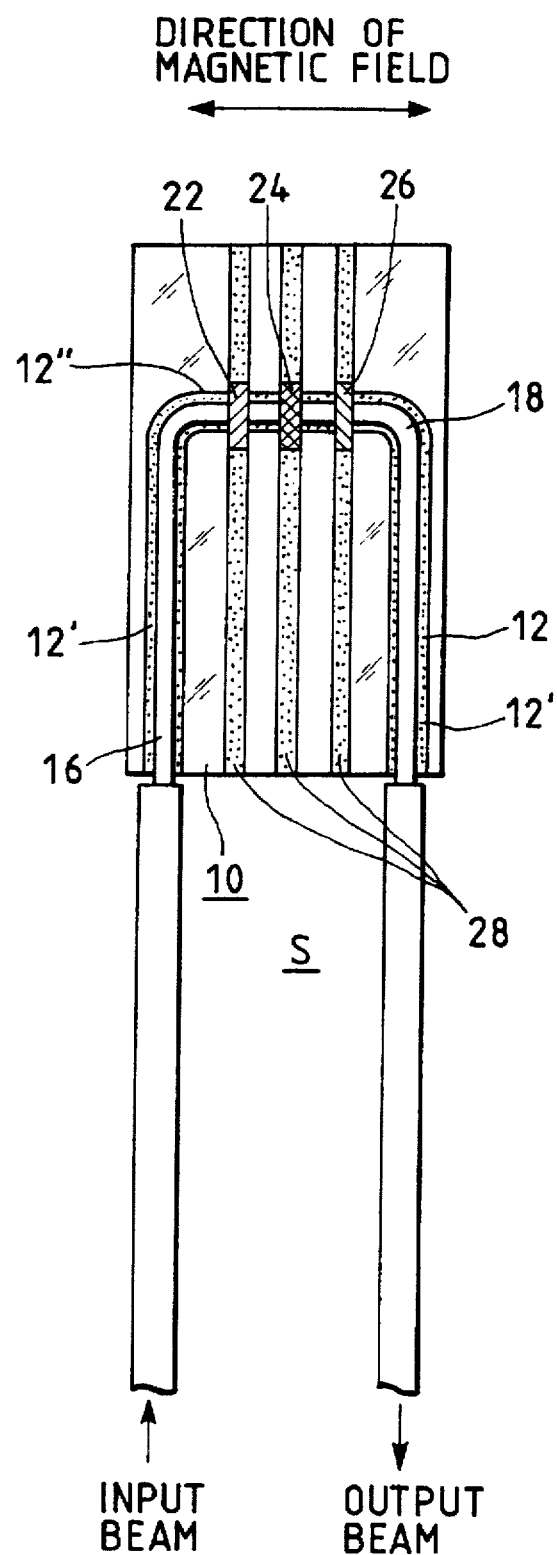
FIGS. 10 and 11 are respectively, schematic views showing optical fiber sensors according to further embodiments of the invention wherein a groove pattern in the substrate is formed according to sand blasting or molding or etching.
Figure 11:
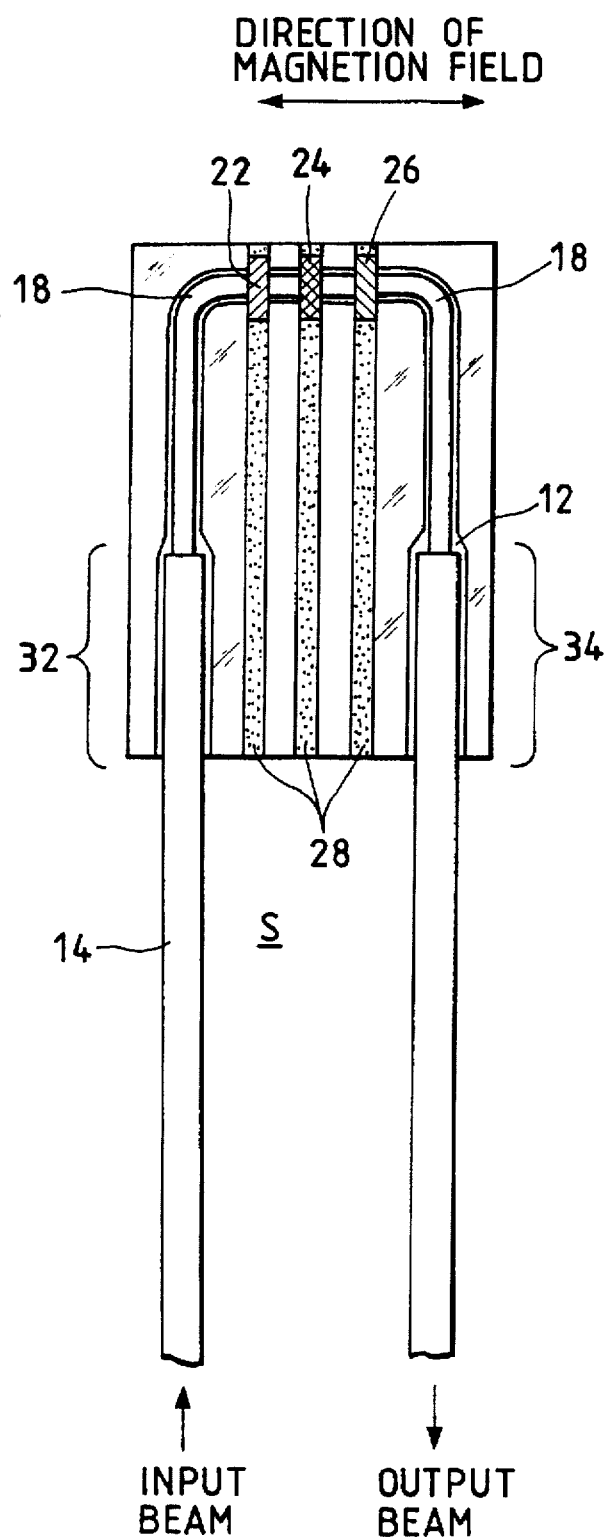

In the foregoing embodiments, the groove pattern is formed by use of a rotating blade saw. Reference is now made to FIGS. 10 and 11 wherein sand blasting or molding in a mold or etching is used to make a groove pattern 12.

In embodiments shown in FIGS. 10 and 11, the groove pattern 12 is shaped in the form of an inverted U form as viewed in these figures. Three grooves in which optical elements 22, 24 and 26 are to be inserted extend along the grooves 12' kept away from each other at intervals and provided between the two grooves 12'. Fundamentally, this grooved substrate is similar to that of FIG. 1.

This type of groove pattern is formed according to a procedure of sand blasting, etching or molding.

When using sand blasting, a substrate 10 is attached with a mask made, for example, of a vinyl resin film tape which is resistant to sand blasting. By the masking, an inverted U form is exposed for sand blasting. In this state, the substrate is subjected to sand blasting by a usual manner wherein the substrate 10 is set in a sand blaster and grooved in a desired pattern through the mask to a depth, for example, of 100 to 1000 μm.

The substrate used for the sand blasting is made, for example, soft glasses, which are likely to be formed with a groove by sand blasting, such as Pyrex glass, leas glass, blue flat glass and the like. In this procedure, a mask pattern is used so that curved or bent portions having pattern can be formed as having a radius of curvature similar to that of the shaped bare optical fiber portion 16.

Figure 12:
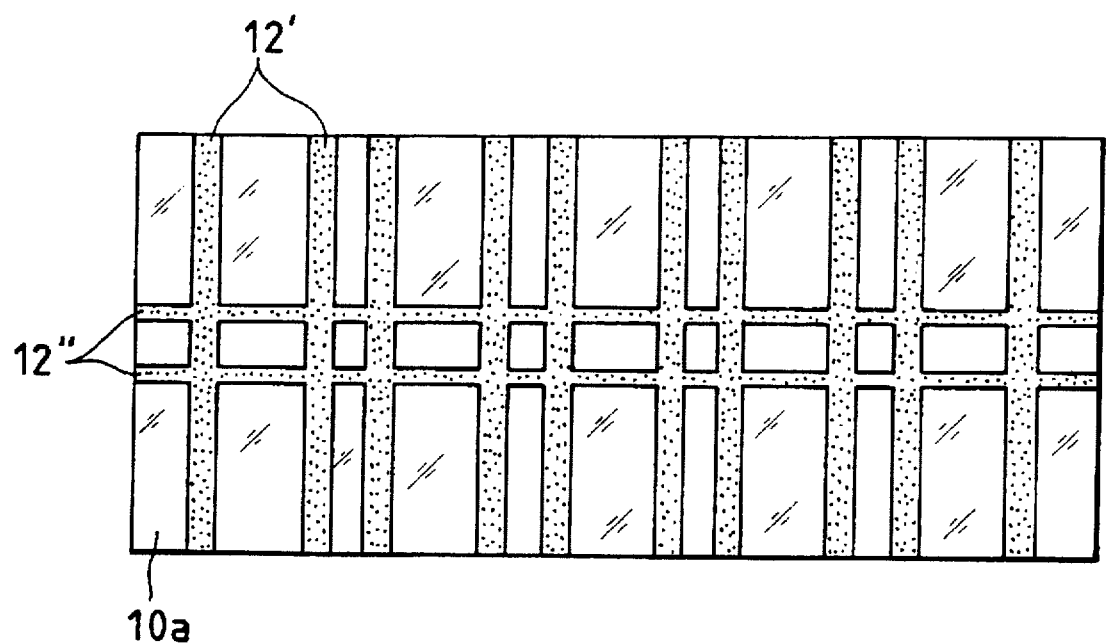
FIGS. 12 and 13 are, respectively, schematic views showing fabrication of a plurality of optical fiber sensors according to another embodiment of the invention.

Likewise, the groove pattern 12 of FIG. 10 or 12 may be formed by etching. In the case, a resist is coated on a substrate and preliminarily dried, followed by exposure to light in a desired pattern, drying and developing. The thus pattern-bearing substrate is subjected to etching in an appropriate etchant such as a hydrofluoric acid-based etchant thereby forming a groove pattern with a depth of 100 to several hundreds μm. Although this etching technique is not necessarily satisfactory with respect to the dimensional accuracy, the grooved substrates can be fabricated at a speed two to ten times as high as that of the sand blasting or rotating blade saw techniques.

Next, the groove pattern 12 may be formed using a mold. In this case, a ceramic substrate or an engineering plastic resins of the type as set forth hereinbefore, in which a filler is added to make a smaller coefficient of thermal expansion and improve mechanical strength, is placed in a mold capable of providing a desired groove pattern as shown in FIG. 10. With the ceramic substrate, the molded substrate is fired or sintered as usual.

FIG. 11 shows another embodiment of the embodiment of the invention in which part of the jacketed portions 32, 34 of the jacketed optical fiber 14 are inserted into the groove pattern 12, like the embodiment of FIG. 9. To this end, the groove pattern 12 is formed as being wider at portions corresponding to 32, 34 to accomodate the jacketed portions 30, respectively. This type of patterning readily feasible by any of sand blasting, etching or molding.

In the embodiments shown in FIGS. 10 and 11, three grooves 28 are formed as described hereinbefore to make a sensor S in a manner similar to the foregoing embodiments. As a matter of course, one groove 28 may be formed in which an integrated optical modulation unit is set in position.

In the embodiments of FIGS. 10 and 11, the size of the substrate initially provided is not critical. More particularly, after formation of a desired pattern in the substrate, it may be cut off appropriately to provide a grooved substrate suitable for use as an optical fiber sensor.

In all the embodiments set out hereinbefore, the shaped bare optical fiber portion 16 having two bent portions 18, more or less, suffers an optical loss owing to the fact the fiber portion 16 is exposed. In order to reduce the optical loss, it is preferred that the bare optical fiber portion 16 is coated with a metal or a polymer composition comprising fine particles of metals. The metal coating is effected by a silver mirror reaction electroless plating, electrolytic plating or the like. Examples of the metal include Au, Ag, Pt, Ni, Cu, Al or the like. The bare optical fiber portion may be deposited with a metal prior to or after shaping in a thickness of from 2 to 200 μm. The silver minor reaction is relatively simple in operation because pro-cleaning of an optical fiber is simple. The electroless plating is simple in plating operations but is relatively complicated in protreatments. Further, a thickness sufficient for this purpose may not be achieved only by electroless plating. Accordingly, electroplating may be required, thus in turn, requiting additional steps. Vacuum deposition techniques may be used to form a metal film on the bare fiber. Usually, the vacuum deposition is effective in coating flat sheets. With optical fibers having bent or curved portions, such a fiber has to be rotated in vacuum or has to be removed from a vacuum chamber, after which the optical fiber is set in a different position, followed by vacuum deposition again. Thus, the procedure becomes complicated although the optical loss can be reduced as desired by electroplating or vacuum deposition.

With a polymer paste comprising fine particles of at least one metal selected from Ag, Au, Pt, Ni, Cu, Al and the like, the paste is coated onto the bare optical fiber portion and dried to obtain a coated optical fiber portion. Thus, the procedure is very simple. Examples of the polymer used in the paste include epoxy resins, acrylic resins and the like. The metal particles have a size of from 5 to 200 μm and are preferably added to the polymer paste in an amount of from 10 to 99 wt%.

By the coating or metal deposition, a beam escaped to a cladding layer may be appropriately transmitted without release in air or an adhesive layer. Of course, the coating or deposit of a selected metal enhances the reflectivity at the surface of the bare optical fiber portion and is relatively stable in air, thus being suitable from the standpoint that the reflectivity is unlikely to degrade as time passes.

Fabrication of a plurality of optical fiber sensors is described with reference to FIGS. 12 and 13.

FIG. 12 shows a substrate 10a having a large area sufficient to make a plurality of sensors. This large-sized substrate 10a is formed with grooves 12', 12" by means of a rotating blade saw. In the figure, the grooves 12', 12" are formed as corresponding to ten groove patterns for optical fiber sensors. When comparing with the case where one substrate is formed with a groove pattern, a larger-size substrate is set on a stage for a rotating blade saw in this embodiment and is automatically processed as desired, so that productivity can be remarkably improved.

Figure 13:
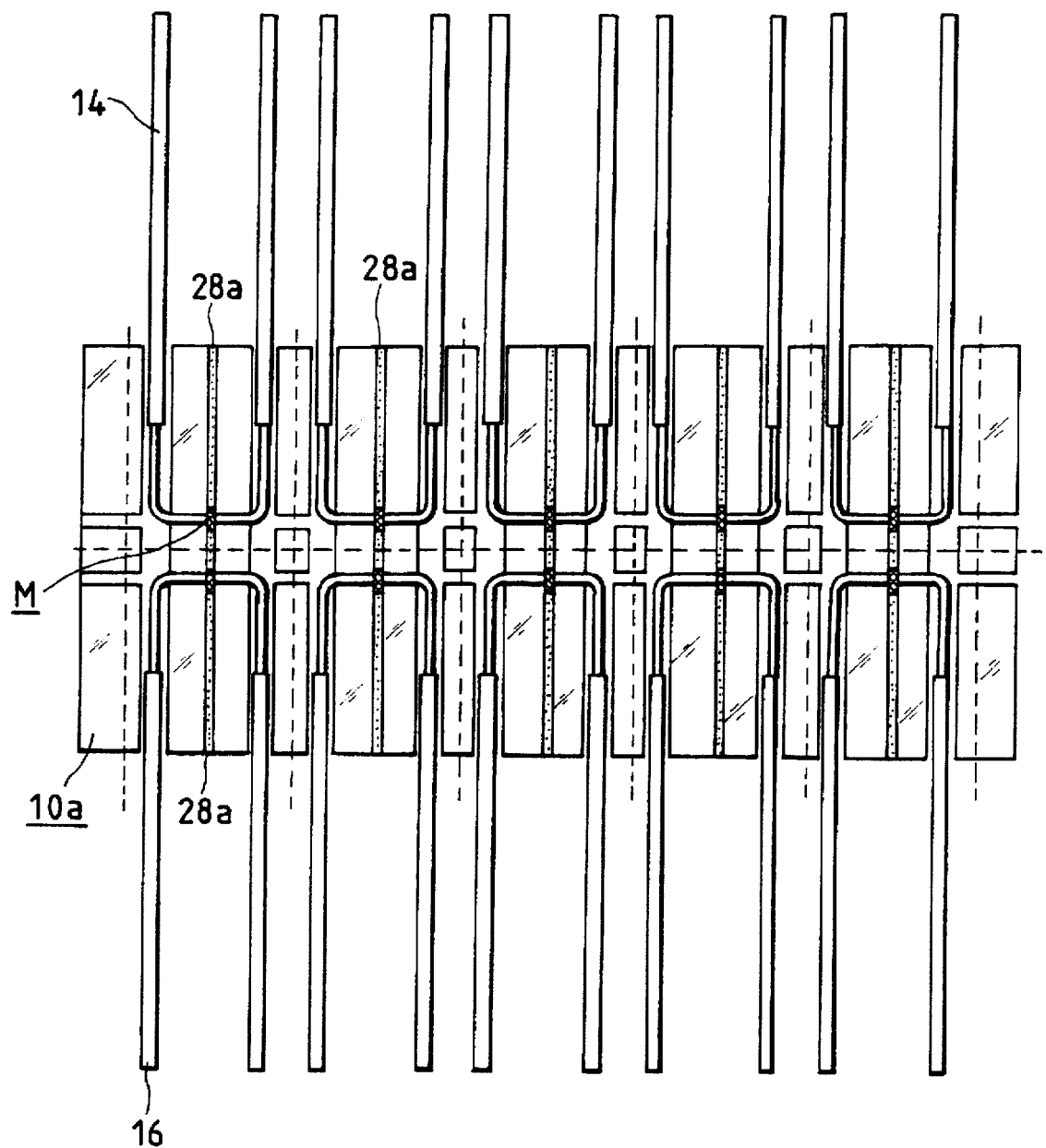

In this state, a plurality of shaped optical fiber members 14 are, respectively, set in and fixed to individual groove patterns as shown in FIG. 13. Thereafter, the procedures of FIGS. 6c and d are substantially repeated except that one groove 28a for inserting an optical modulation unit M is formed for each sensor unit in this embodiment. The optical modulation unit M is set and fixed in position to obtain a plurality of sensors in the large-sized substrate. In this embodiment, the unit M is depicted as an integrally combined unit. The large-sized substrate is then cut along the dotted fines to obtain individual optical fiber sensors. In the case of FIG. 13, ten sensors are fabricated at one time. The fabrication time of the ten sensors can be reduced to ⅓ to ⅕ of the case where tens sensors are fabricated one by one.

As a matter of course, three grooves 28a may be formed so that optical elements are separately set in the respective grooves 28a.

The number of the sensors to be fabricated may be optionally determined. A smaller or greater number of sensors may be likewise fabricated. In the embodiment of FIGS. 12 and 13, although the sensor units are formed on two fabrication lines, one fabrication line or four fabrication lines may be used. If a square substrate is used, four sides of the square substrate may be used along which grooves patterns are formed.

In the embodiment of FIGS. 12 and 13, the use of a rotating blade saw has been described. Needless to say, etching, sand blasting or molding may be likewise used, with similar results.

As will be apparent from the foregoing, the optical fiber sensor has a belt structure, so that the sensor can be reduced in size along its length. This is advantageous in that when such an optical fiber sensor is applied as a current sensor, the gap of an iron core at which a magnetic field is concentrated at the sensor head can be made small, thus being very effective in high sensitivity of the sensor. In addition, the small iron core gap ensures a reduced influence of an external magnetic field.

The radius of curvature of a shaped bare optical fiber is determined depending on the size of an optical fiber sensor and a tolerance of optical loss. When the radius of curvature, R (mm), is in the range of $0.3 \leq R \leq 15$ mm and the absolute value of the optical loss is not greater than 5 dB, the absolute value of optical loss of the optical fiber sensor can be reduced to a level of not larger than 30 dB as a whole. Although depending on the type of signal processing circuit, it becomes possible to process sensor signals appropriately as an optical fiber sensor system using the optical fiber sensor of the invention. More preferably, the radius, R, is in the range of $0.3 \leq R \leq 5$ mm, by which the sensor is fabricated as being smaller in size. It will be noted here that if $R < 0.3$ mm, the absolute value of optical loss at the bent portions may undesirably increase or the bent portions may not be formed reproducibly.

The optical fiber sensor of the invention has no coupling portion between an optical waveguide and an optical fiber in the vicinity of beam inlet and outlet portions, no optical loss is involved in such coupling portion.

Although a silica optical fiber may be used in the practice of the invention, multicomponent optical fibers or plastic optical fibers are preferably used by which the bending of such fibers is conveniently possible at relatively low temperature. The multicomponent and plastic optical fibers are so arranged that the difference in refractive index between the core and the cladding layer is made great. This eventually leads to the use of optical fibers whose numerical aperture is greater than that of silica optical fibers.

In order to insert an optical modulation unit M in the groove or grooves 28, it is preferred that when the width of each groove 28 is taken as Lg (mm) and the numerical aperture of an optical fiber is taken as NA, the relation of NA×Lg≦0.55. By this, the absolute value of optical loss can be reduced to a level of not higher than 5 dB. The value of NA×Lg can be reduced to a level as small as possible by decreasing the groove width, Lg. Accordingly, it is more preferred that 0<NA×Lg≦0.55. The parameters of the optical fiber used are not limited including the numerical aperture provided that the relation between NA and Lg should preferably be satisfied.

As set out hereinbefore, fixing of a bare optical fiber portion with or without coating of a metal or metals or polymer-metal compositions or of a jacketed optical fiber is possible by use of any of ceramic bonding agents, resin adhesives, solders, low melting glasses and the like. The resin adhesives are preferably used since they are able to fix at relatively low temperatures or room temperature. The ceramic bonding agents mainly composed of inorganic ceramics are curable at room temperature and exhibit good adhesion to glass. In addition, the ceramic bonding agents have a coefficient of thermal expansion smaller than resin adhesives and are advantageous in that the coefficient is at a level similar to that of glass used for optical fibers.

With solder and low melting glasses, higher temperatures are required than those required for resin adhesives but they are more reliable with respect to the fixing.

Accordingly, it is preferred that the bare optical fiber portion with or without coating of a metal or metals or polymer-metal compositions is fixed by means of any of ceramic bonding agents, lower melting glasses or solders having high bonding strength and that the jacketed optical fiber is bonded with resin adhesives which are excellent in adhesion to organic matters.

Moreover, materials used for an optical modulator or element have been described including garnet crystals for current sensors, LiNbO$_3$, LiTaO$_3$ or the like for the electric field sensors, GaAs, Si, Ge, chalcogenide glasses, Nd:glasses or the like for the temperature sensors. Besides, liquid crystals may be likewise used as having an electrooptic effect. Using liquid crystals, an optical modulator having a thickness of several μm to several hundreds μm can be made. When a liquid crystal cell is placed in the light path, an optical loss is not so great and is thus favorable. Dielectric crystals having an electrooptic effect may also be used. In this case, the thickness of the crystals becomes large, thus increasing an optical loss. However, such dielectric crystals are more reliable than liquid crystal compounds.

The polarizer, optical element, λ/4 plate and analyzer as used in an optical modulation unit should preferably be formed as having a rectangular main surface through which a beam is transmitted, with the result that the polarizing direction of a transmitting beam through these elements can be visually judged. Accordingly, when these elements are set in and fixed to a substrate, the polarizing direction can be determined quickly without failure. Such optical elements should preferably have a length which is at least two times the width of the groove 28.

The optical sensors and fabrication thereof have the following advantages.

The optical fiber is substantially in an inverted U form having portions bent substantially at 90° with or without being rounded off at the portions and a beam is directly passed to an optical modulation unit, so that lenses, lens holders and a reflection mirror as will be required in prior art are not necessary.

Optical elements are set in a groove or grooves formed in a substrate, ensuring easy adjustment of optical axes of these elements. This optical elements which are smaller in size than prior art counterparts are used for setting in the groove or grooves, thus proving good economy.

The groove pattern and grooves for inserting optical elements can be relatively readily formed by use of a rotating blade saw, sand blasting, etching or molding.

Productivity of optical fiber sensors can be drastically increased by forming a plurality of groove patterns in a large-sized substrate, fixing a shaped optical fiber in the respective pattern, forming a groove or grooves for inserting optical elements in a light path of the optical fiber, setting the optical elements in position and cutting the substrate into individual sensors.

The optical fiber is assembled as bent, so that the length of the resultant sensor can be made small. Where this type of sensor is used in a gap of an iron core as a current sensor, a smaller gap is sufficient for this purpose than in prior art case, ensuring higher sensitivity and a less influence of an external magnetic field.

The bent portions of the bare optical fiber portion is covered with a metal or a polymer composition comprising fine particles of a metal or metals. By the covering, the absolute value of optical loss can be reduced and the resultant sensor has a good SN ratio.

The jacketed optical fiber is partly fixed to a groove pattern of a substrate along with a jacket at least one of groove portions in the vicinity of at least one of beam inlet and outer portions of the substrate. By this, the optical fiber is more unlikely to break by application of mechanical force exerted on the fiber at the beam inlet or outlet portions.

Optical fibers including multicomponent optical fibers and plastic optical fibers are reproducibly bent or curved as desired by use of a blower provided with an electric resistance heater, which will be difficult in prior art.

The present invention is more particularly described by way of examples, which should not be construed as limiting the invention thereto.

EXAMPLE 1

An optical fiber was provided, from which a jacket and a buffer layer were removed as shown in FIG. 4b to provide a bare optical fiber portion consisting of a core and a cladding layer provided that a surface treating agent used to ensure good bonding of the buffer layer to the cladding layer might not be removed.

The exposed optical fiber portion was bent and rounded at a desired radius of curvature along a groove of a stainless steel or ceramic die by means of a blower with an electric resistance heater at a temperature of 450° to 600° C. when the optical fiber used was a multicomponent optical fiber and at a temperature of from 80° to 250° C. for a plastic optical fiber, e.g. polymethyl methacrylate. In this manner, the bare optical fiber portion was bent at two portions to provide a shaped optical fiber as shown in FIG. 4d.

Where the optical fiber used was a multicomponent glass optical fiber which had a numerical aperture of 0.4, a core diameter of 200 μm and a optical fiber diameter of 250 μm, the bare optical fiber portion could be bent at two portions each having a radius of curvature, R, in the range of 0.3 to 15 mm. Moreover, the radius of curvature in the range of 0.3 to 5 mm was reproducibly attained. The radius smaller than 0.3 was difficult for reproducible fabrication.

Separately, a glass substrate was prodded and grooved by use of a rotary blade saw in a pattern as shown in FIG. 5b. The groove pattern was formed at a blade saw speed of not lower than 1 mm/second and the blade saw was made of grains having a size of 60 μm (#200).

In order to receive the shaped optical fiber having a relatively large radius of curvature in the groove pattern, the grooves along the length of the substrate were formed two times the diameter of the optical fiber.

The shaped bare optical fiber portion was fixed to the groove pattern by means of a ceramic bonding agent comprised of $Al_2O_3$ and $SiO_2$.

Subsequently, three grooves were formed in parallel to the lengthwise grooves of the groove pattern so that a polarizer, an optical modulator and an analyzer were inserted in the light path of the fixed optical fiber in this order. The groove formation was effected using a rotating blade saw made of gains whose size was 15 μm. The grooves for this insertion had a width, Lg, of 0.51 mm. The optical elements were fixed to the respective grooves by means of an epoxy resin adhesive. The analyzer and the polarizer were, respectively, made of a glass polarizing plate having a thickness of 0.5 mm. The optical modulator was made of a Bi-substituted garnet film consisting of $(BiYGdLa)_3(FeGa)_5O_{12}$ epitaxially grown on a $(GdCa)_3(MgZrGa)_5O_{12}$ substrate. This modulator was 0.5 mm in thickness.

For the fixing, the polarizing planes of transmitted light of the polarizer and the analyzer were set as to be mutually inclined at 45°. As a result, an optical fiber current sensor of the type as shown in FIG. 1 was fabricated.

When the radius of curvature was in the range of 0.3 to 3 mm, the optical fiber sensor was so fabricated as to have a substrate width of 10 mm along the direction of magnetic field to be applied. In addition, when the radius was in the range of 3 to 5 mm, the substrate width could be at 15 mm.

The thus fabricated current sensors were subjected to measurements of a modulation ratio and also of a linearity error in relation to the variation in magnetic field generated by application of AC current using a system shown in FIG. 3.

Figure 14A:
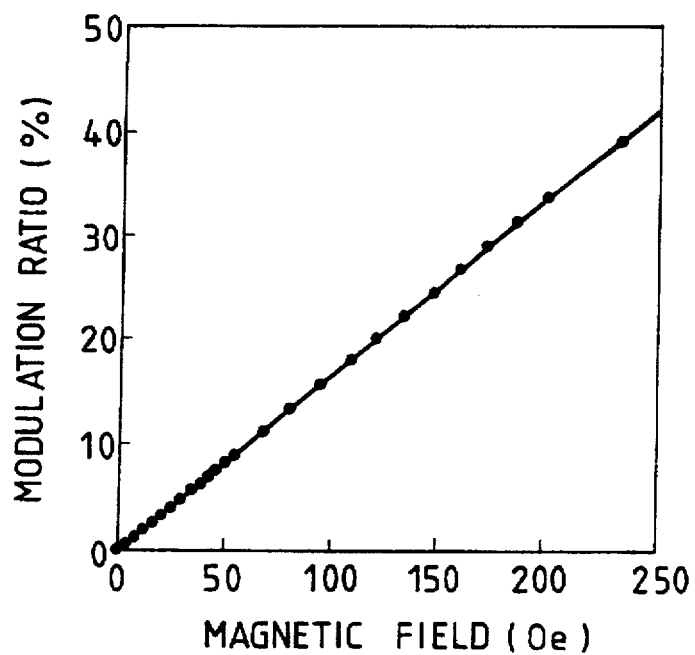
FIGS. 14a and 14b are, respectively, graphs showing the relation between the modulation ratio and the magnetic field and also the relation between the linearity error and the magnetic field of an optical sensor of the invention.
Figure 14B:
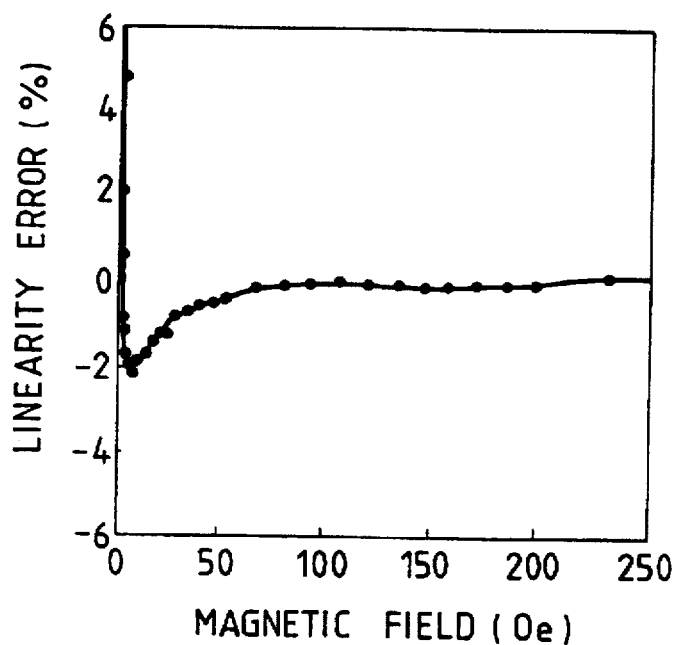

The modulation ratio is shown in FIG. 14a and the linearity error is shown in FIG. 14b. It will be noted that the term "linearity error" used herein is defined as follows.

$$\text{Linearity error (\%)} = \frac{(\text{sensor output signal} - \text{input signal})}{\text{input signal}} \times 100$$

As will be apparent from FIG. 14a, the modulation ratio changes in proportion to the magnetic field.

The linearity error characteristic is within ±2% in the range of magnetic field of 10 to 250 Oe and within ±1% in the range of 30 to 250 Oe as is particularly shown in FIG. 14b. The optical fiber current sensor of this example had a temperature dependence characteristic of ±2% in the temperature range of −20° to 80° C. The optical loss was −28 dB when the radius of curvature, R, was 0.3 mm and −23 dB for R=5 mm.

More particularly, the total optical loss resulting from the polarizer, garnet crystals and analyzer was found to be −10 dB when determined by an optical loss tester and the optical loss of the three grooves for the polarizer, garnet crystals and analyzer, each having a groove width, Lg, of 0.51 mm amounted to about −9 dB. When R=0.3 mm, the optical loss at the two bent portions of the bars optical fiber portion was −3 dB in total. The balance was a loss (about −6 dB) escaped from the optical fiber through the cladding layer owing to the application of adhesive to the bent portions.

With the case where R=5 mm, the optical loss at the two bent portions was −1 dB. When the adhesive was applied to the bent portions, the beam transmitted through the cladding layer escaped from the optical fiber, resulted in a loss of −3 dB. Other optical losses were similar to the case of R=0.3

In the signal processing circuit used in this example, the magnetic field or current could be measured even when the optical loss was as great as −30 dB.

Figure 15:
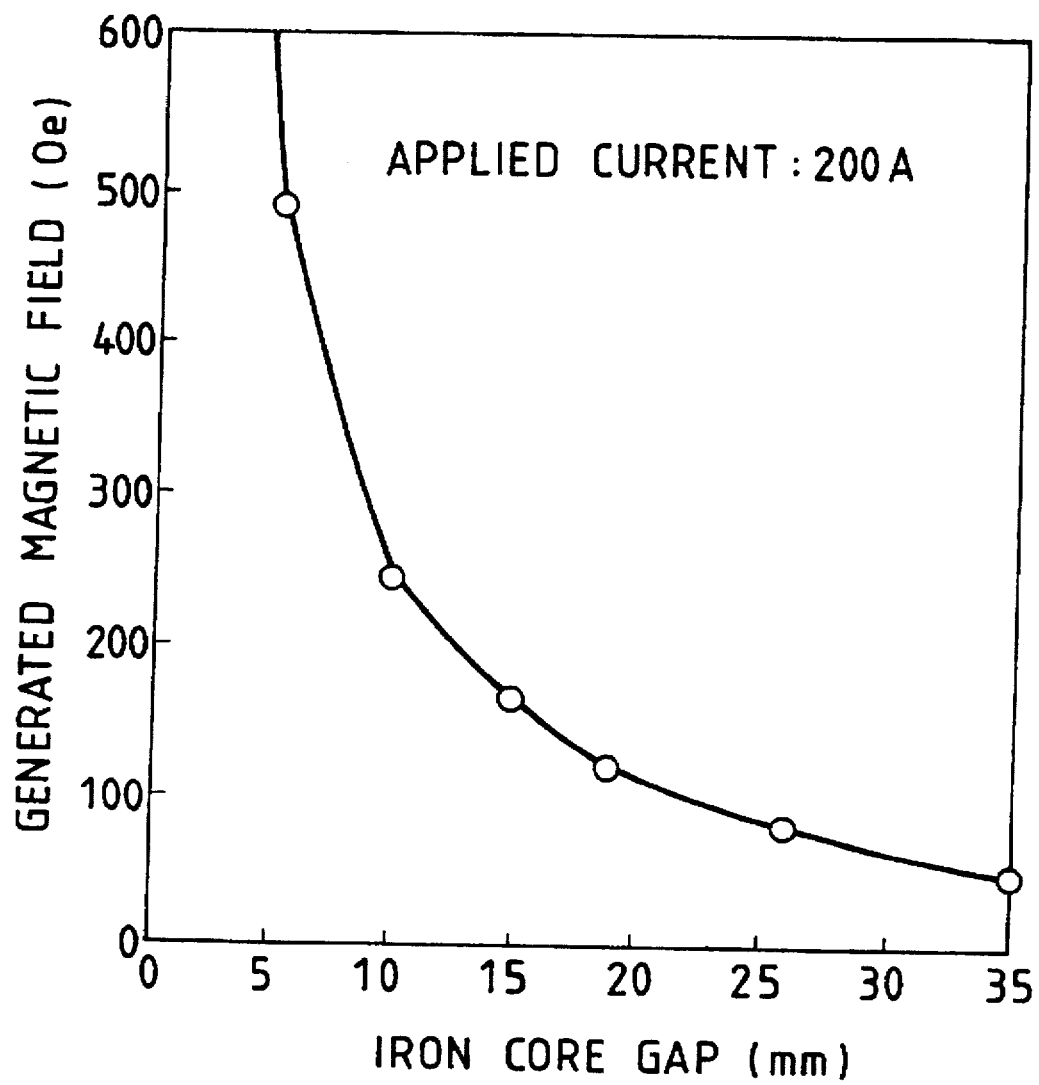
FIG. 15 is a graph showing the relation between the generated magnetic field and the gap of an iron core at a constant current of 200 amperes when an optical fiber current sensor is set in a system of FIG. 3.

The magnetic field sensors obtained in this example were used to determine the relation between the generated magnetic field and the gap of an iron core using the system of FIG. 3 using the magnetic field sensor of this example. In this measurement, the gap distance was changed, under which a magnetic field generated in the core gap was measured. The results are shown in FIG. 15. It will be noted that for prior art optical fiber sensors, the core gap has to be set at approximately 20 mm. With the sensors of the present invention, a smaller gap can be established using a smaller size of sensor. As will be apparent from FIG. 15, when the gap is reduced to 10 mm, the current detection sensitivity becomes two times as great as that of the prior art. In addition, when the gap is reduced to 5 mm, the sensitivity becomes four times or over as great as that of the prior art.

The sensors of the type shown in FIG. 1 were fabricated using optical fibers having bent portions having different radii of curvature, R (mm), and having difference numerical apertures. These sensors were subjected to measurement of an optical loss at the bent portions.

Figure 16:
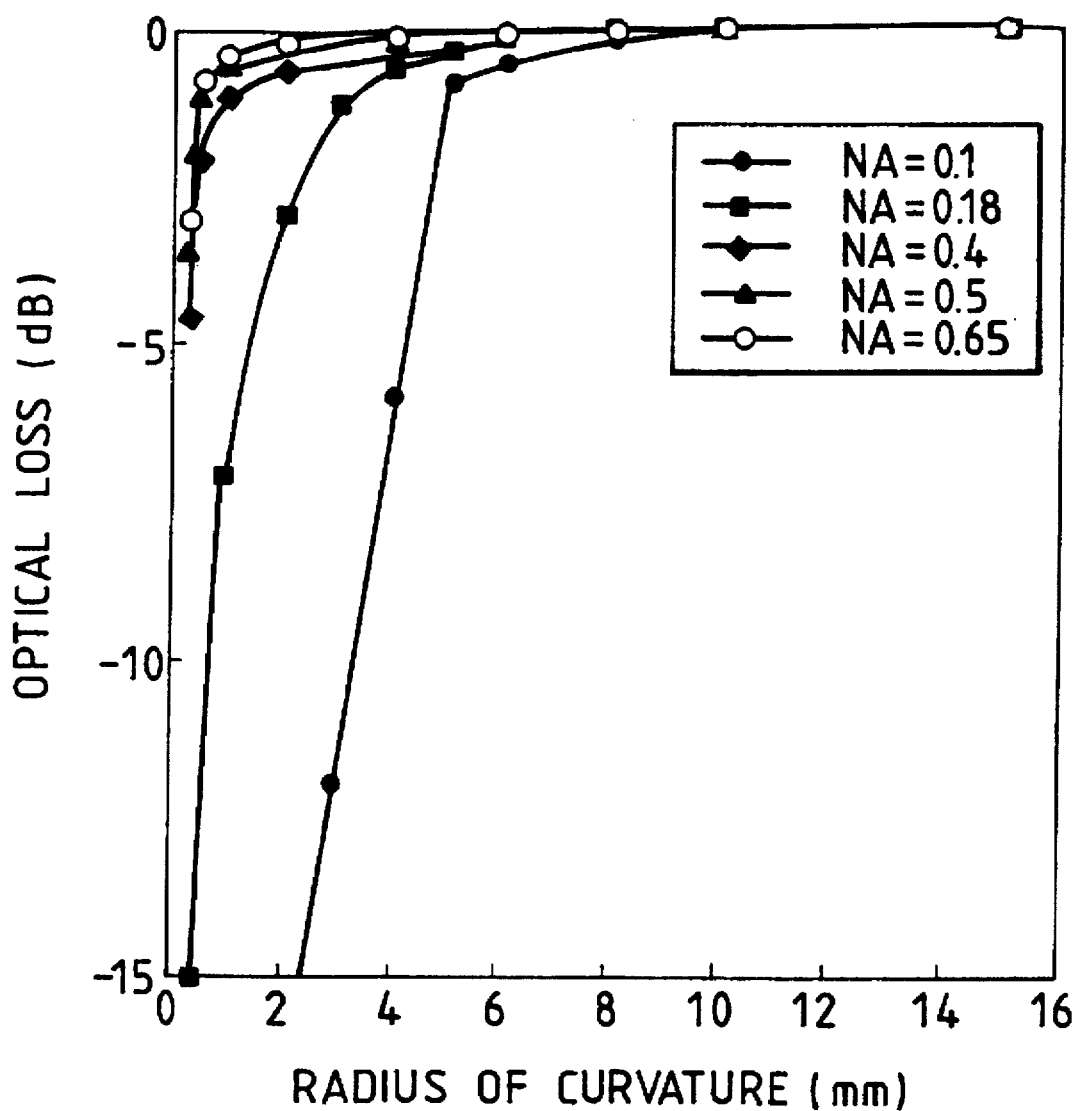
FIG. 16 is a graph showing the relation between the optical loss and the bending radius at bent portions of a shaped, bare optical fiber portion for different numerical apertures.

The results are shown in FIG. 16, revealing that when the radius, R, is in the range of 0.3 to 15 mm at least for the numerical aperture of 0.4 or over, the optical loss (absolute value of the loss) can be reduced to a level not higher than 5 dB. As will be apparent from the figure, a smaller numerical aperture requires a larger radius of curvature. Although depending on the performance of a signal processing circuit, the optical fiber sensor whose absolute value of total loss is not higher than 30 dB permits an output signal from the sensor to be processed without difficulty.

The optical modulation unit including the polarizer, optical modulator or element and analyzer has an absolute value of total optical loss of not larger than 10 dB. Grooves for inserting the optical elements in the light path of the sensor involves a loss of 5 dB for one groove and 15 dB for three groves in a maximum. The total maximum optical loss reaches 25 dB to 35 dB. Proper selection of the number and width of the grooves for insertion of the optical elements and the radius of curvature of the bent portions ensures an absolute value of total optical loss which is at a level not higher than 30 dB.

Figure 17:
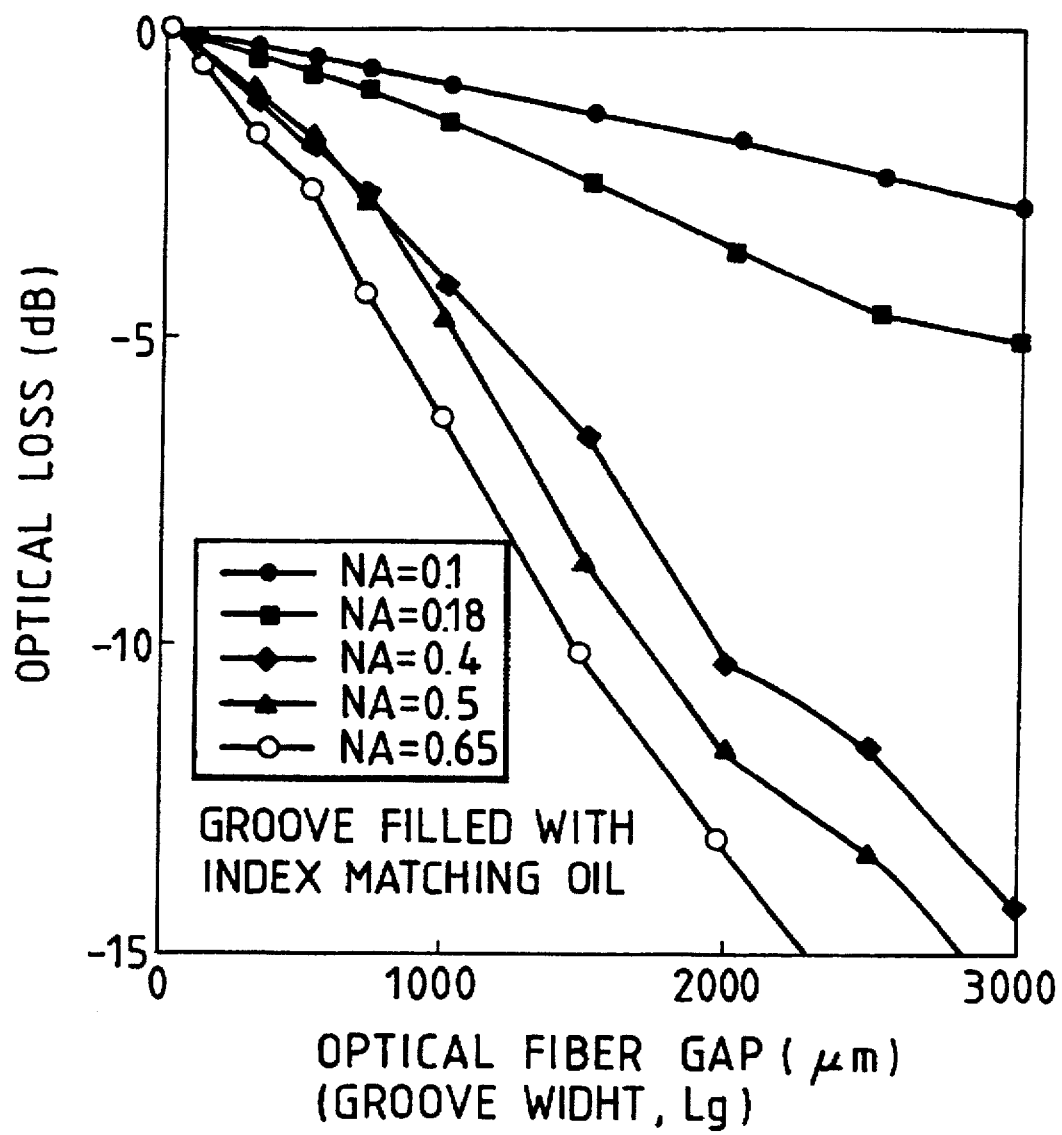
FIG. 17 is a graph showing the relation between the optical loss and the width of grooves for inserting optical elements for different numerical apertures of optical fiber using an index matching oil filled in the grooved portions of a bare optical fiber in which the optical elements are inserted.
Figure 18:
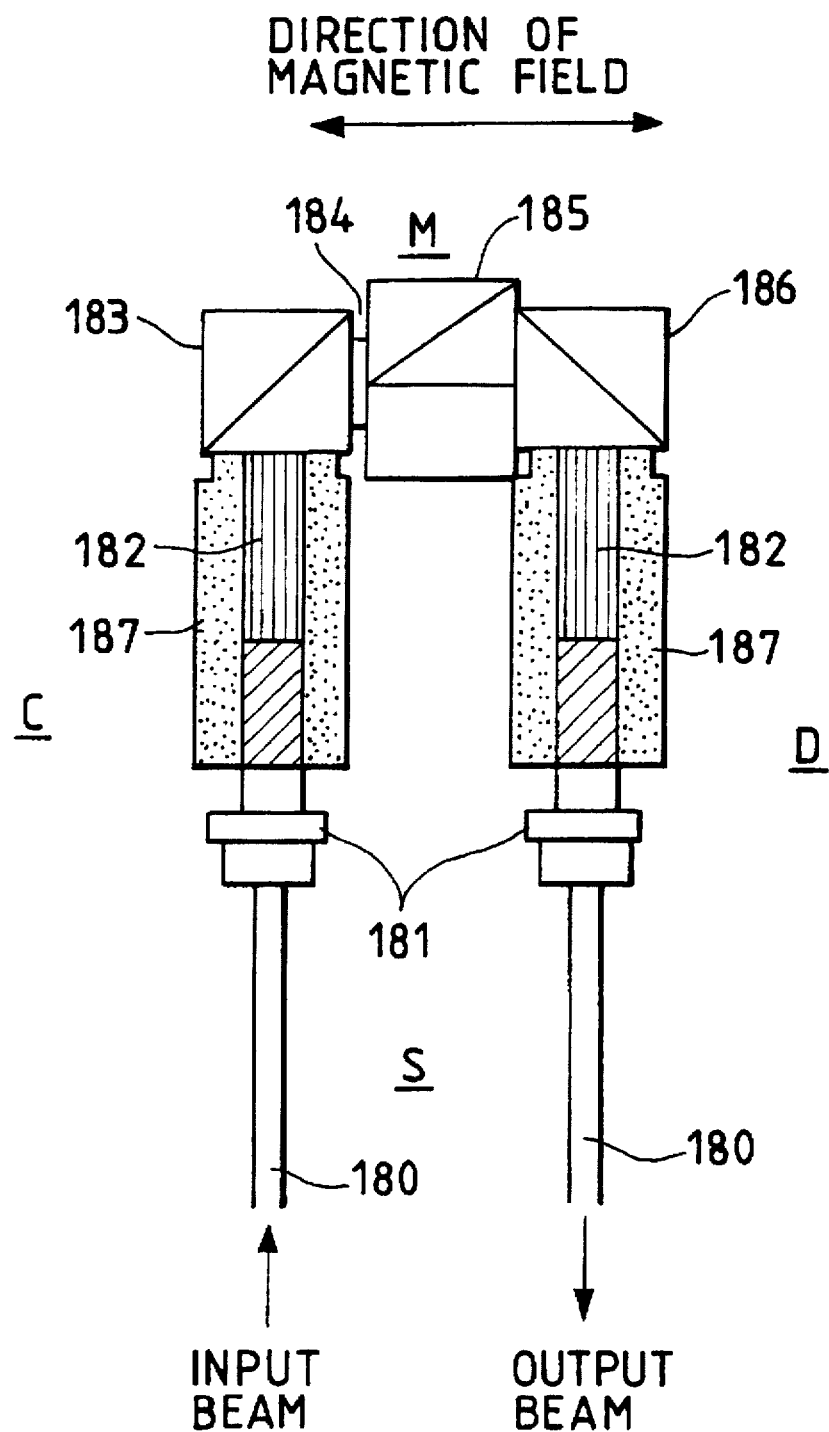
FIG. 18 is a known optical fiber current sensor.

Moreover, the general procedure of Example 1 was repeated using optical fibers having different numerical apertures wherein each fiber fixed to the groove of the substrate was cut away by means of a rotating blade saw. In this condition, a refractive index matching oil having a refractive index of 1.5 was filled in the respective grooves to evaluate an optical loss caused by the gaps of the optical fiber. In order to change the numerical aperture, different types of optical glass fibers including silica fibers, multicomponent glass optical fibers and plastic fibers were used. The results of the optical loss in relation to the distance of the optical fiber gap (μm) are shown in FIG. 17.

The reason why the index matching oil was filled in the grooves is that the beam emitted from the end faces of the optical fiber was diverged at the same angle as with the case where an element was inserted into the groove. It will be noted that when an element made of a material whose refractive index is greater than 1.5 is inserted, the divergent angle of beam becomes smaller, resulting in the tendency that the optical loss is smaller. For instance, the garnet substrate has a refractive index of 1.9 and the Bi-substituted garnet film has a refractive index of 2.2 to 2.5. From the above, when the numerical aperture, NA, of the optical fiber and the width, Lg (mm), of the element-inserting groove is such that NA×Lg ≦0.55, the absolute value of optical loss can be suppressed to a level not higher than about 5 dB. This value is enough for use as an optical fiber sensor. The value of NA×Lg comes very close to zero if the thickness of an optical element is as close as to zero. Accordingly, if 0<NA×Lg≦0.55, an absolute value of optical loss per unit insertion groove can be reduced to 5 dB or below. Any type of optical fiber may be used provided the above requirement is satisfied.

In this example, the magnetooptic material used was made of the Bi-substituted garnet crystals. Other magnetooptic materials such as CdMnTe, Tb-glass and the like may be likewise usable.

EXAMPLE 2

In this example, a sensor of the type shown in FIG. 7 was made. The general procedure of Example 1 was repeated except that each bent portion of the optical fiber had two equally angled points each curved at 45° and the substrate was grooved in a manner similar to FIG. 1 but grooves 12b were, respectively, formed as intersecting with the lengthwise grooves 12 at 45° as shown in FIG. 7.

Moreover, the shaped bare optical fiber portion was fixed to the groove pattern by means of a room temperature curable ceramic bonding agent made primarily of $Al_2O_3$ and $SiO_2$, followed by treatment at approximately 100° C. by which a greater bonding force was attained. The polarizer, optical element and analyzer were set in and fixed to the substrate by use of a photocurable resin adhesive having a refractive index of about 1.5 after curing.

By the arrangement, the effective radius of curvature could be made larger than in the case of Example 1 although the size of a final sensor become larger, resulting in a reduced absolute optical loss.

When the effective radius of curvature of this type of sensor was in the range of 5 to 15 mm, an optical loss was in the range of −24 to −22 dB with a modulation ratio of 0.18%/Oe. The linearity characteristic was similar to that of Example 1.

The sensor having such a structure as shown in FIG. 7 was fabricated as having a width of substrate of 25 mm along the direction of magnetic field when the effective radius of curvature was in the range of 5 to 10 mm and of 35 mm when the effective radius was in the range of 10 to 15.

In this example, the bending angle at one bend point was 90/2 =45°. An optical fiber sensor was similarly fabricated when bent at a bending angle of 90/3 =30° for one bend point in which case one bent portion should have three bend points each at a bending angle of 30°.

EXAMPLE 3

A sensor having such a structure as shown in FIG. 8 was fabricated in this example. In this example, the sensor of FIG. 1 was so processed that the intersections of the grooves in the substrate were each rounded by means of a grind stone which had a shaft and was made of grains having an average size of 60 μm or over and a grinder. One intersection was rounded within 30 to 60 seconds. By this rounding procedure, it was not necessary to make wide grooves 12 as shown in FIG. 8. Nevertheless, a shaped bare fiber portion having two bent portions each with a radius of curvature, R, of 3 to 15 mm could be set in and fixed to the grooves. The optical loss could be reduced to a level as small as −25 to −21 dB.

EXAMPLE 4

In this example, the sensor of FIG. 9 was made in which the grooves 12 were formed in a width as wide as two times the diameter of a jacketed optical fiber. More particularly, the general procedure of Example 1 was repeated except that the grooves 12 were formed so widely as set out above and the jacketed portions 30 of the optical fiber were fixed to the substrate by means of a thermosetting epoxy resin adhesive as shown in FIG. 9. By this arrangement, the breakage of the optical fiber portion in the vicinity of beam input and output portions 32, 34 could be prevented.

The sensor had an optical loss of −27 dB to −24 dB and a modulation ratio of beam output relative to an external magnetic field w as 0.17/Oe. The linearity error characteristic was similar to that of Example 1.

EXAMPLE 5

In this example, a sensor of the type shown in FIG. 2a was fabricated.

The general procedure of Example 1 was repeated except that only one groove for insertion of an optical modulation unit was formed and the optical modulation unit was made of an integrally combined unit and that the jacketed portions 32, 34 of FIG. 2a were set in and fixed to the groove pattern 12.

The integrally combined unit consisted of a 0.2 mm thick glass polarizer and a 0.2 mm thick glass analyzer between which a magnetooptic element, i.e. the Bi-substituted garnet film formed on a substrate, was provided. The garnet film and a garnet substrate were both polished and the total thickness thereof was 0.1 mm (film thickness: 0.06 mm and substrate thickness: 0.04 mm). The polarizer, element and analyzer were bonded together so that the polarizer and the analyzer were inclined at about 45° with respect to the polarizing planes thereof.

When the grooves 12' were formed at 1.03 to 1.5 times the diameter of the jacketed optical fiber and the radius of curvature at the bent portions 18 was in the range of 0.3 to 1.5 mm, the width of the substrate along the direction of a magnetic field to be applied could be made as small as 5 mm. More particularly, the sensor substrate fabricated had a size of 25 mm long,×5 mm wide and 1 mm wide. The optical loss of these sensor ranged from −23 to −21 dB with a modulation ratio of beam output relative to an external magnetic field being 0.17%/Oe. The linearity error characteristic was similar to that of Example 1.

When this type of sensor was applied to a current sensing system of FIG. 3, the gap of the iron core 104 could be made small enough to set the 5 mm wide sensor in position. The sensor of this example exhibited about 4 times higher in sensitivity than known counterparts relative to the current passing through the electric power cable 100 of FIG. 3.

It should be noted that when the garnet film from which the substrate had been completely removed therefrom can also be used, with similar results.

EXAMPLE 6

In this example, optical fiber current sensors of the type shown in FIGS. 10 and 11 are described.

A glass substrate such as Pyrex glass, lead glass or blue plate glass was provided, on which a vinyl resin masking tape was placed. The masking tape was formed with a pattern corresponding to a groove pattern to be formed on the glass substrate. In this state, the substrate was set in a sand blaster to make the groove pattern in a depth of 100 to 1000 μm. In this case, a desired radius of curvature could be readily made unlike the case using a rotating blade saw.

If it was desired to make a groove pattern having wider groove portions as shown in FIG. 12, the mask pattern was made in such a way as to correspond to the groove pattern of FIG. 12.

Thereafter, a separately shaped optical fiber was set in and fixed to the groove pattern as in the foregoing examples, followed by forming three grooves by means of a rotating blade saw and fixing optical elements in position by means of an adhesive.

This type of sensor had a similar modulation ratio relative to a magnetic field as in Example 1.

If a large-sized substrate is used on which a plurality of pattern-bearing masking tapes are attached, a plurality of optical fiber sensors can be fabricated, at one time, after cutting the substrate into individual sensor units.

EXAMPLE 7

Sensors of the type shown in FIGS. 10 and 11 may be fabricated using etching techniques.

A BK 7 glass substrate was first provided and applied with a photoresist film according to a spin coating method and dried. The resist film was exposed to in an imagewise pattern corresponding to a groove pattern, fully dried and developed to obtain a visible pattern. The resultant BK 7 glass substrate was subjected to etching with a hydrofluoric acid etchant for 5 to 15 minutes to form a groove pattern with a depth of 100 to several hundreds μm. Then, the general procedure of Example 1 was repeated to obtain an optical fiber sensor.

This etching technique is not so good as sand blasting or rotating blade saw techniques with respect to the dimensional accuracy. However, a great number of patterns may be readily formed on a substrate with high productivity. More particularly, the fabrication speed of grooves substrates by etching was higher by 2 to 10 times than those speeds attained by sand blasting or rotating blade saw techniques.

EXAMPLE 8

An optical fiber sensor of the type shown in FIG. 1 was fabricated using a plastic optical fiber made of polymethyl methacrylate, which had a numerical aperture of 0.5, a core diameter of 230 μm and an optical fiber diameter of 250 μm. The plastic fiber was bent as in FIG. 1 by application of hot air from a blower with an electric resistance heater at a temperature of 80° to 250° C. The bending radius was 2 mm. The thus shaped fiber was fixed to the substrate by use of a room temperature curable resin. The resultant sensor had an optical loss of −26 dB and a modulation ratio mid a linearity error characteristic similar to those of the sensor of Example 1.

EXAMPLE 9

This example illustrates an electric field sensor which has a structure similar to that shown in FIG. 1 provided that polarizing planes of the polarizer and the analyzer are set parallel to each other.

The general procedure of Example 1 was repeated except that there were used, instead of the garnet crystal modulator, a λ/4 quartz plate with a thickness of about 27 μm and a 2 mm thick $LiNbO_3$ crystal film bonded together for use as an electrooptical element and that because a 2 mm wide groove was difficult to form at one time by means of a rotating blade saw, the wide groove was formed by repeating twice a formation procedure using a blade having a thickness of 1 mm and made of grains having a size of#400 (30 μm) and a grooving speed of 0.1 mm/second. The groove width was found to be 2.05 mm owing to the vibrations of the blade saw. Lead wires flora electrodes deposited on the $LiNbO_3$ crystal film were, respectively, fixed to electrodes on the sensor substrate.

The resultant optical fiber sensor had an optical loss of −28 dB. When a potential of 100 V was applied between the electrodes of the sensor, the modulation ratio was found to be 1.1%.

EXAMPLE 10

An optical fiber sensor of the type as shown in FIG. 11 was fabricated in the same manner as in Example 9 for use as an electric field sensor provided that the polarizing planes of the polarizer and the analyzer were in parallel to each other and that a λ/4 quartz plate and a 0.4 mm thick liquid crystal cell were bonded to provide an optical modulator. Lead wires from the liquid crystal cell were, respectively, fixed, by means of solder, to gold electrodes deposited on a sensor substrate made of glass.

The optical loss of the sensor was found to be −24 dB. When a potential of 5 V was applied between the sensor electrodes, the modulation ratio was found to be 57%. Thus, the sensitivity was as high as about 100 times that of the sensor of Example 9 using the inorganic bulk crystals of $LiNbO_3$.

The reason why the optical loss was not so small as compared with the case of Example 9 is considered for a great optical loss of the liquid crystal cell.

EXAMPLE 11 to 18

An optical fiber current sensor of the type shown in FIG. 2a was fabricated. The general procedure of Example 5 was repeated except that an optical fiber used was a multicomponent glass optical fiber having a core diameter of 200 μm, a fiber diameter of 250 μm and a numerical aperture of 0.4 and that the optical fiber was shaped as shown in FIG. 2a with a bending radius of about 0.5 to 1 mm at two bent portions. The bent portions were coated or deposited with various types of metals and metal-polymer pastes having 60 to 95 wt% of metal particles having a size of 5 to 20 μm according to various coating and depositing procedures shown in Table 1. The resultant sensors were subjected to measurement of an optical loss. The results are shown in Table 1.

TABLE 1

| Examples | Kind of Metal | Manner of Coating or Deposition | Optical Loss (dB) | Working Properties |
| --- | --- | --- | --- | --- |
| 5 | nil | — | −24 to −21 | — |
| 11 | Ag | coating of paste | −16 | very simple |

TABLE 1-continued

| Examples | Kind of Metal | Manner of Coating or Deposition | Optical Loss (dB) | Working Properties |
|---|---|---|---|---|
| 12 | Au | coating of paste | −16 | very simple |
| 13 | Ag | silver mirror reaction | −15 | fairly simple |
| 14 | Ni | electroless plating | −16 | fairly complicated |
| 15 | Ni | electroless plating + electroplating | −15 | complicated |
| 16 | Cu | electroplating | −16 | complicated |
| 17 | Pt | vacuum deposition | −15 | very complicated |
| 18 | Al | vacuum deposition | −15 | very complicated |

As will be apparent from the above Table, the coating of a silver paste or gold paste has a great effect on reduction of the optical loss and is very simple in operation. The procedure using the silver mirror reaction is simple with respect to pre-cleaning of the optical fiber and is thus relatively simple in operation, with a great optical loss reducing effect. The electroless plating is simple in the plating operations but its pretreatment is relatively complicated. In some case, an adequately thick film cannot be formed only by the electroless plating. In the case, electroplating will become necessary, thus being complicated in operation. The vacuum deposition is easy for application onto a flat sheet but the shaped optical fiber has to be rotated in vacuum or has to be once removed from a vacuum chamber, followed by further vacuum deposition. Thus, the vacuum deposition is not easy. Nevertheless, a good optical loss reduction can be attained by the vacuum deposition and also by electroplating.

What is claimed is:

1. An optical fiber sensor which comprises:
   a substrate having a groove pattern
   an optical fiber which includes a shaped bare optical fiber portion of an inverted U form having two bent portions and capable of being received or accommodated in the groove pattern of said substrate, and jacketed optical fiber portions extending from the shaped bare optical fiber portion at opposite ends thereof, said shaped bare optical fiber portion being fixed to in the groove pattern of said substrate and having thereon a metal coating or a coating of a dispersion of metal particles in a polymer matrix; and
   an optical modulation unit which is fixedly provided in a light path of the optical fiber and placed in at least one groove formed in the said substrate,
   wherein when said optical fiber has a numerical aperture, NA, and said groove pattern has a groove width, Lg, expressed in mm, a product of said numerical aperture and said groove width is in a range $0 < NA \times Lg \leq 0.55$.

2. An optical fiber sensor according to claim 1, wherein said optical modulation unit comprises a polarizer, an optical modulator and an analyzer disposed in three grooves formed in said substrate at spaces therebetween and sequentially arranged in this order so that optical axes of the polarizer, the optical modulator and the analyzer are aligned whereby said sensor is a magnetic field or current sensor.

3. An optical fiber sensor according to claim 2, wherein said optical modulator consists essentially of garnet crystals having a magnetooptic effect.

4. An optical fiber sensor according to claim 2, wherein said polarizer, said optical modulator and said analyzer are integrally combined together.

5. An optical fiber sensor according to claim 1, wherein said optical modulation unit comprises a polarizer, an optical modulator and an analyzer disposed at spaces therebetween and sequentially arranged in this order so that optical axes of the polarizer, the optical modulator and the analyzer are aligned, and a λ/4 plate provided between said polarizer and said optical modulator whereby said sensor is an electric field or voltage sensor.

6. An optical fiber sensor according to claim 5, wherein said optical modulator consists essentially of dielectric crystals or a liquid crystal having an electrooptic effect.

7. An optical fiber sensor according to claim 5, wherein said polarizer, said λ/4 plate, said optical modulator and said analyzer are integrally combined together.

8. An optical fiber sensor according to claim 1, wherein said optical modulation unit is made of a material sensitive to temperature wherein said sensor is a temperature sensor.

9. An optical fiber sensor according to claim 1, wherein said groove pattern is constituted of two parallel grooves and one straight groove intersecting with said two parallel grooves substantially at an angle of 90°.

10. An optical fiber sensor according to claim 9, wherein the intersections are rounded thereby permitting said shaped bare optical fiber portion to be reliably received in said groove pattern.

11. An optical fiber sensor according to claim 1, wherein said two bent portions have, respectively, two bend points bent substantially at 45° for each bend point so that a total bending angle is 90°.

12. An optical fiber sensor according to claim 1, wherein at least one of the jacketed optical fiber portions is partly fixed to said groove pattern in the vicinity of a beam inlet or outlet portion in the groove pattern of said substrate.

13. An optical fiber sensor according to claim 12, wherein both jacketed optical fiber portions are partly fixed to said groove pattern.

14. An optical fiber sensor according to claim 1, wherein said groove pattern has at least one groove portion, which is wider than other groove portions, in the vicinity of beam inlet or outlet of said substrate or in the vicinity of groove portions corresponding to the bent portions of said shaped, bare optical fiber portion.

15. An optical fiber sensor according to claim 14, wherein said groove pattern has groove portions, which are wider than other groove portions, all in the vicinity of beam inlet and outlet of said substrate and in the vicinity of groove portions corresponding to the bent portions of said shaped, bare optical fiber portion.

16. An optical fiber sensor according to claim 14, wherein the wider groove portions have a width 1.03 to 5 times as great as a diameter of the jacketed optical fiber portion.

17. A optical fiber sensor according to claim 1, wherein said optical fiber is a member selected from the group consisting of multicomponent glass optical fibers and plastic optical fibers.

18. An optical fiber sensor according to claim 1, wherein said shaped optical fiber is fixed with at least one member selected from the group consisting of ceramic bonding agents, solders, low melting glasses and resin binders.

19. An optical fiber sensor according to claim 1, wherein said metal coating consists of a least one member selected from the group consisting of Ni, Cu, Ag, Au, Pt and Al.

20. An optical fiber sensor according to claim 1, wherein said optical modulation unit comprises a polarizer, an optical modulator, an analyzer and optionally a λ/4 plate which are, respectively, in a rectangular form having a length two times or more of the width of the groove for insertion.

21. An optical fiber sensor according to claim 1, wherein said metal particles consist of at least one member selected from the group consisting of Ni, Cu, Ag, Au, Pt and Al.

22. An optical fiber sensor claim 1, wherein said two bent portions have, respectively, a radius, R, of curvature of $0.3 \leq R \leq 15$ mm and an absolute value of optical loss at each bent portion is not larger than 5 dB.

23. A method for fabricating an optical fiber sensor which comprises:

(a) providing a substrate;

(b) forming a groove patter having a groove width Lg in the substrate;

(c) maintaining a product of said groove width, expressed in mm, and of a numerical aperture NA of said groove pattern in a range $0<NA \times Lg \leq 0.55$;

(d) separately providing an optical fiber having a bare optical fiber portion and jacketed optical fiber portions extending from opposite ends of the bare optical fiber portion and shaping the bare optical fiber portion under heating conditions substantially in an inverted U form having two bent portions so that said two bent portions have, respectively, a radius, R, of curvature of $0.3 \leq R \leq 15$ mm and capable of being received or accommodated in the groove pattern;

(e) setting and fixing the shaped bare optical fiber portion in the groove pattern;

(f) forming at least one groove in the substrate extending in parallel to two parallel grooves of the inverted U-shaped groove pattern through the fixed optical fiber portion; and (g) fixedly setting an optical modulator unit in a light path of the optical fiber by inserting the unit in the at least one groove.

24. A method according to claim 23, wherein said groove pattern including elongated parallel grooves and at least one groove intersecting with the two parallel elongated grooves is formed by means of a rotating blade saw at a forming speed of 0.01 to 1 mm/second.

25. A method according to claim 24, wherein said rotating blade saw is made of abrasive grains having a size of 60 to 3 µm.

26. A method according to claim 24, wherein the two bent portions are rounded off.

27. A method according to claim 24, wherein said two elongated parallel grooves are formed to have a width which is 1.03 to 5 times as wide as a diameter of the jacketed optical fiber.

28. A method according to claim 23, wherein said groove pattern is formed by sand blasting.

29. A method according to claim 23, wherein said groove pattern is formed by etching.

30. A method according to claim 23, wherein said groove pattern is formed by molding.

31. A method according to claim 23, wherein said optical fiber is a multicomponent glass optical fiber or a plastic optical fiber and is shaped by means of a blower having an electric resistance heater therein.

32. A method according to claim 31, wherein said optical fiber is a multicomponent glass optical fiber and is bent at a temperature of from 450° to 600° C.

33. A method according to claim 31, wherein said optical fiber is a plastic optical fiber and is bent at a temperature of from 80° to 280° C.

34. A method according to claim 23, further comprising applying a paste of metal particles in a polymer matrix to the bare optical fiber portion and drying the applied paste to form a coating layer on the bare optical fiber portion.

35. A method according to claim 23, further comprising forming a metal coating on the bare optical fiber portion by silver mirror reaction, plating or vacuum deposition.

36. A method according to claim 23, further comprising forming a plurality of groove patterns on the substrate, repeating the steps (c) to (f) of claim 25 for each groove pattern, cutting the substrate into individual sensor units wherein a plurality of sensors are fabricated at one time.

37. An optical fiber sensor which comprises:

a substrate having a groove pattern;

an optical fiber which includes a thermally shaped bare optical fiber portion of an inverted U form having two bent portions each having a radius R, of curvature of $0.3 \leq R \leq 15$ mm and capable of being received or accommodated in the groove pattern of said substrate, and jacketed optical fiber portions extending from the shaped bare optical fiber portion at opposite ends thereof, said thermally shaped bare optical fiber portion being fixed to in the groove pattern of said substrate, wherein when said optical fiber has numerical aperture, NA, and said groove pattern has a groove width, Lg, expressed in mm, a product of said numerical aperture and said groove width is in a range $0<NA \times Lg \leq 0.55$; and an optical modulation unit which is fixedly provided in a light path of the optical fiber and placed in at least one groove formed in said substrate.

38. An optical fiber sensor according to clam 37, wherein said optical modulation unit comprises a polarizer, an optical modulator and an analyzer disposed in three grooves formed in said substrate at spaces therebetween and sequentially arranged in this order so that optical axes of the polarizer, the optical modulator and the analyzer are aligned whereby said sensor is a magnetic field or current sensor.

39. An optical fiber sensor according to claim 38, wherein said optical modulator consists essentially of garnet crystals having a magnetooptic effect.

40. An optical fiber sensor according to claim 38, wherein said polarizer, said optical modulator and said analyzer are integrally combined together.

41. An optical fiber sensor according to claim 37, wherein said optical modulation unit comprises a polarizer, an optical modulator and an analyzer disposed at spaces therebetween and sequentially arranged in this order so that optical axes of the polarizer, the optical modulator and the analyzer are aligned, and a $\lambda/4$ plate provided between said polarizer and said optical modulator whereby said sensor is an electric field or voltage sensor.

42. An optical fiber sensor according to claim 37, wherein at least one of the jacketed optical fiber portions is partly fixed to said groove pattern in the vicinity of a beam inlet or outlet portion in the groove pattern of said substrate.

43. A optical fiber sensor according to claim 37, wherein said optical fiber is a member selected from the group consisting of multicomponent glass optical fibers and plastic optical fibers.

44. An optical fiber sensor according to claim 37, wherein said shaped optical fiber is fixed with at least one member selected from the group consisting of ceramic bonding agents, solders, low melting glasses and resin binders.

* * * * *